US012812767B2

(12) United States Patent
Shin et al.

(10) Patent No.: US 12,812,767 B2
(45) Date of Patent: Nov. 24, 2026

(54) CIRCUIT BOARD WITH THREE SLOPED INNER WALLS

(71) Applicant: LG INNOTEK CO., LTD., Seoul (KR)

(72) Inventors: Jong Bae Shin, Seoul (KR); Soo Min Lee, Seoul (KR); Jae Hun Jeong, Seoul (KR); Ji Chul Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 162 days.

(21) Appl. No.: 18/714,337

(22) PCT Filed: Nov. 29, 2022

(86) PCT No.: PCT/KR2022/019076

§ 371 (c)(1),
(2) Date: May 29, 2024

(87) PCT Pub. No.: WO2023/096462

PCT Pub. Date: Jun. 1, 2023

(65) Prior Publication Data

US 2025/0024587 A1 Jan. 16, 2025

(30) Foreign Application Priority Data

Nov. 29, 2021 (KR) ........................ 10-2021-0167679
Dec. 1, 2021 (KR) ........................ 10-2021-0170036

(51) Int. Cl.
*H05K 1/02* (2006.01)
*H05K 1/11* (2006.01)

(52) U.S. Cl.
CPC ............. *H05K 1/0237* (2013.01); *H05K 1/11* (2013.01)

(58) Field of Classification Search
CPC ...... H05K 1/0237; H05K 1/11; H05K 3/0035; H05K 3/4644; H05K 2201/09827;
(Continued)

(56) References Cited

U.S. PATENT DOCUMENTS 6,228,466 B1 5/2001 Tsukada et al.
7,648,775 B2 * 1/2010 Wakako .............. H10H 20/856 428/668

(Continued)

FOREIGN PATENT DOCUMENTS

JP 2014-197596 A 10/2014
JP 2019-176068 A 10/2019

(Continued)

OTHER PUBLICATIONS

Original and Translation of KR102102322 (Year: 2020).*

(Continued)

*Primary Examiner* — Timothy J. Dole
*Assistant Examiner* — Muhammed Azam
(74) *Attorney, Agent, or Firm* — Birch, Stewart, Kolasch & Birch, LLP

(57) ABSTRACT

A circuit board includes a first insulating layer; a first pattern layer disposed on an upper surface of the first insulating layer; and a second insulating layer disposed on the upper surface of the first insulating layer and an upper surface of the first pattern layer and including a cavity, wherein the upper surface of the first insulating layer includes a first upper surface corresponding to a lower surface of the cavity, and a second upper surface having a step difference from the first upper surface and not vertically overlapping the lower surface of the cavity, wherein the first pattern layer includes a first pattern part disposed on the first upper surface, and a second pattern part disposed on the second upper surface, and wherein a thickness of the first pattern part is smaller than a thickness of the second pattern part.

20 Claims, 19 Drawing Sheets

(58) Field of Classification Search

CPC ......... H05K 2201/10098; H05K 1/183; H05K 3/4697; H10W 44/20; H10W 70/05; H10W 70/614; H10W 70/685; H10W 44/248; H10W 90/701

See application file for complete search history.

(56) References Cited

U.S. PATENT DOCUMENTS

| | | | | |
|---|---|---|---|---|
| 9,282,626 | B2 * | 3/2016 | Yoo | H05K 3/4697 |
| 9,538,650 | B2 * | 1/2017 | Nishida | H05K 1/11 |
| 9,674,938 | B2 * | 6/2017 | Palaniswamy | H05K 1/0206 |
| 9,698,563 | B2 * | 7/2017 | Palaniswamy | H01S 5/024 |
| 9,723,729 | B2 * | 8/2017 | Furusawa | H05K 3/4697 |
| 9,881,858 | B2 * | 1/2018 | Gandhi | H10W 70/05 |
| 10,342,135 | B2 * | 7/2019 | Choi | H05K 1/183 |
| 10,925,163 | B2 | 2/2021 | Park et al. | |
| 10,950,587 | B2 * | 3/2021 | Jeon | H10W 90/00 |
| 11,076,487 | B2 * | 7/2021 | Hwang | H05K 1/182 |
| 11,382,213 | B2 * | 7/2022 | Jeon | H05K 1/0373 |
| 11,470,721 | B2 | 10/2022 | Jung | |
| 11,646,254 | B2 * | 5/2023 | Deng | H10W 70/614 257/774 |
| 11,842,893 | B2 * | 12/2023 | Na | H05K 3/4697 |
| 11,849,546 | B2 | 12/2023 | Kawagoe et al. | |
| 11,979,985 | B2 | 5/2024 | Jung | |
| 12,144,116 | B2 * | 11/2024 | Shin | H05K 1/185 |
| 12,213,253 | B2 * | 1/2025 | Ryu | H05K 3/0032 |
| 12,382,582 | B2 | 8/2025 | Jung | |
| 12,471,213 | B2 * | 11/2025 | Shin | H05K 1/111 |
| 2006/0017152 | A1 * | 1/2006 | White | H05K 1/186 257/E23.173 |
| 2008/0049405 | A1 * | 2/2008 | Sahara | H05K 1/183 29/830 |
| 2012/0153445 | A1 | 6/2012 | Son et al. | |
| 2016/0120033 | A1 * | 4/2016 | Furusawa | H05K 3/4697 174/251 |
| 2018/0033719 | A1 * | 2/2018 | Tsai | H05K 1/115 |
| 2020/0053887 | A1 * | 2/2020 | Bund | H05K 1/0271 |
| 2020/0144234 | A1 * | 5/2020 | Jeon | H10W 90/00 |
| 2021/0185819 | A1 | 6/2021 | Hwang et al. | |
| 2022/0262713 | A1 | 8/2022 | Na et al. | |
| 2022/0377902 | A1 | 11/2022 | Shin et al. | |
| 2022/0418106 | A1 * | 12/2022 | Ryu | H05K 1/0298 |
| 2024/0121903 | A1 | 4/2024 | Kawagoe et al. | |
| 2024/0282685 | A1 * | 8/2024 | Jeong | H10W 70/685 |
| 2025/0024587 | A1 * | 1/2025 | Shin | H05K 1/0237 |
| 2025/0040032 | A1 * | 1/2025 | Shin | H01Q 1/38 |
| 2025/0071898 | A1 * | 2/2025 | Lee | H05K 1/115 |
| 2025/0089172 | A1 * | 3/2025 | Kim | H05K 1/181 |
| 2025/0294667 | A1 * | 9/2025 | Shin | H05K 1/0206 |

FOREIGN PATENT DOCUMENTS

| | | | |
|---|---|---|---|
| JP | 2020-53621 | A | 4/2020 |
| KR | 10-2000-0062265 | A | 10/2000 |
| KR | 10-2012-0067025 | A | 6/2012 |
| KR | 10-1304359 | B1 | 9/2013 |
| KR | 10-2102322 | B1 | 4/2020 |
| KR | 10-2020-0051215 | A | 5/2020 |
| KR | 10-2020-0070773 | A | 6/2020 |
| KR | 10-2020-0142730 | A | 12/2020 |
| KR | 10-2021-0000105 | A | 1/2021 |
| KR | 10-2021-0046978 | A | 4/2021 |
| KR | 10-2021-0070439 | A | 6/2021 |
| KR | 10-2021-0105658 | A | 8/2021 |
| WO | WO 2021/059416 | A1 | 4/2021 |

OTHER PUBLICATIONS

Original and Translation of KR20210112779 (Year: 2021).*
Original and Translation of KR101204359 (Year: 2013).*
Original and Translation of KR20210070439 (Year: 2021).*
Original and Translation of KR20220001202 (Year: 2022).*
Original and Translation of WO2021059416 (Year: 2021).*

* cited by examiner

【FIG. 1】
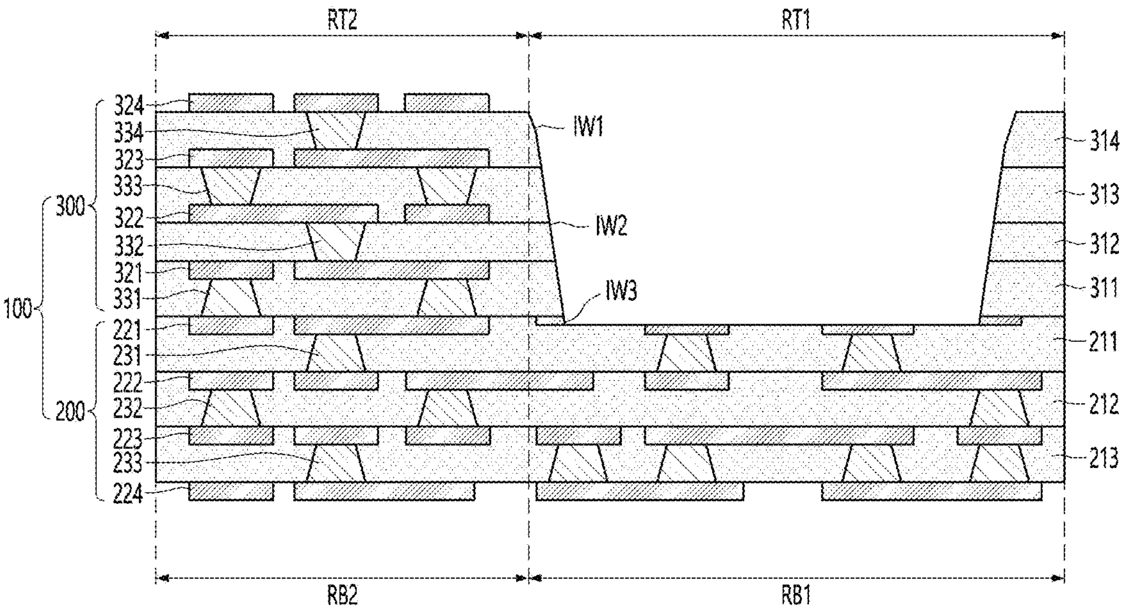
【FIG. 2】
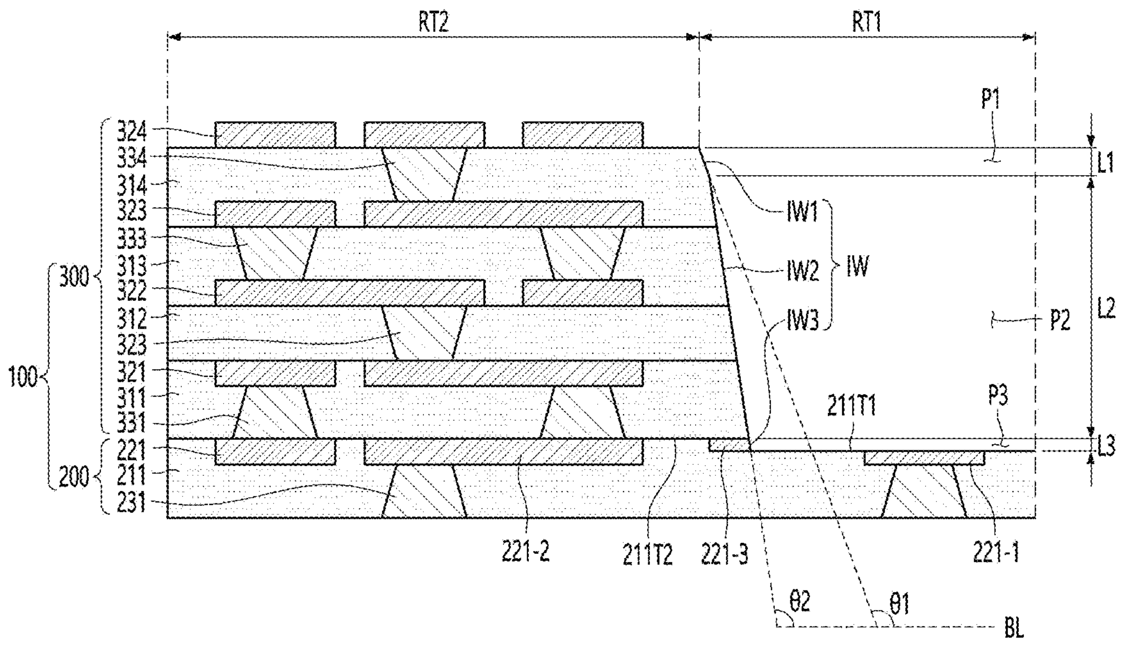

【FIG. 3A】
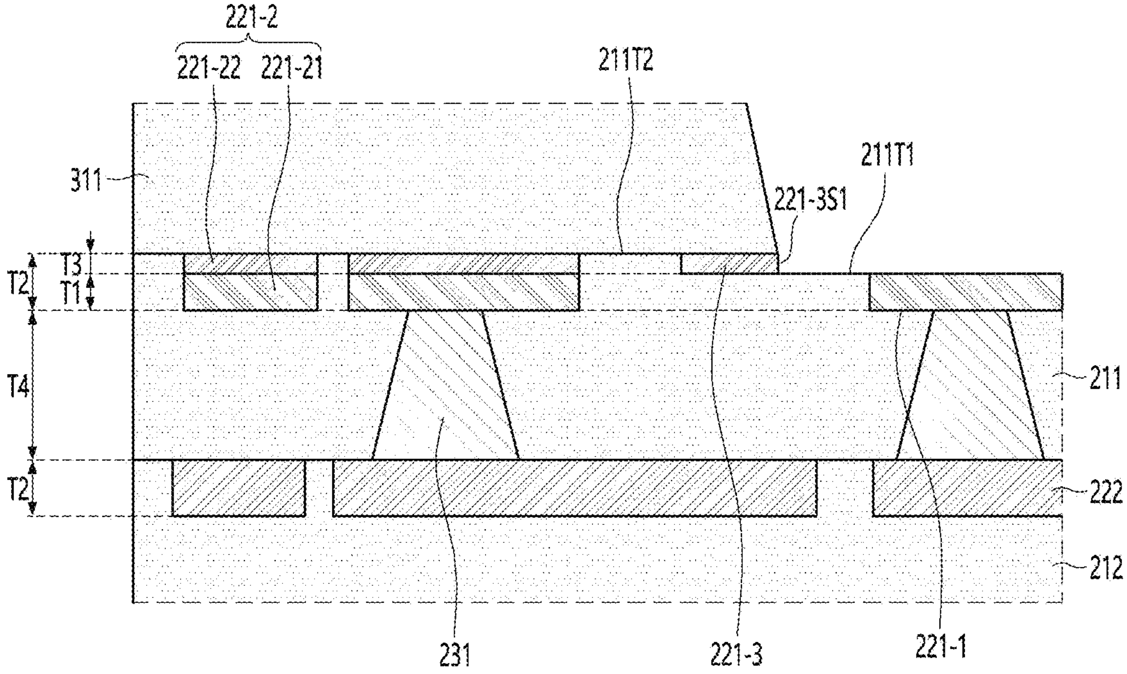

【FIG. 3B】
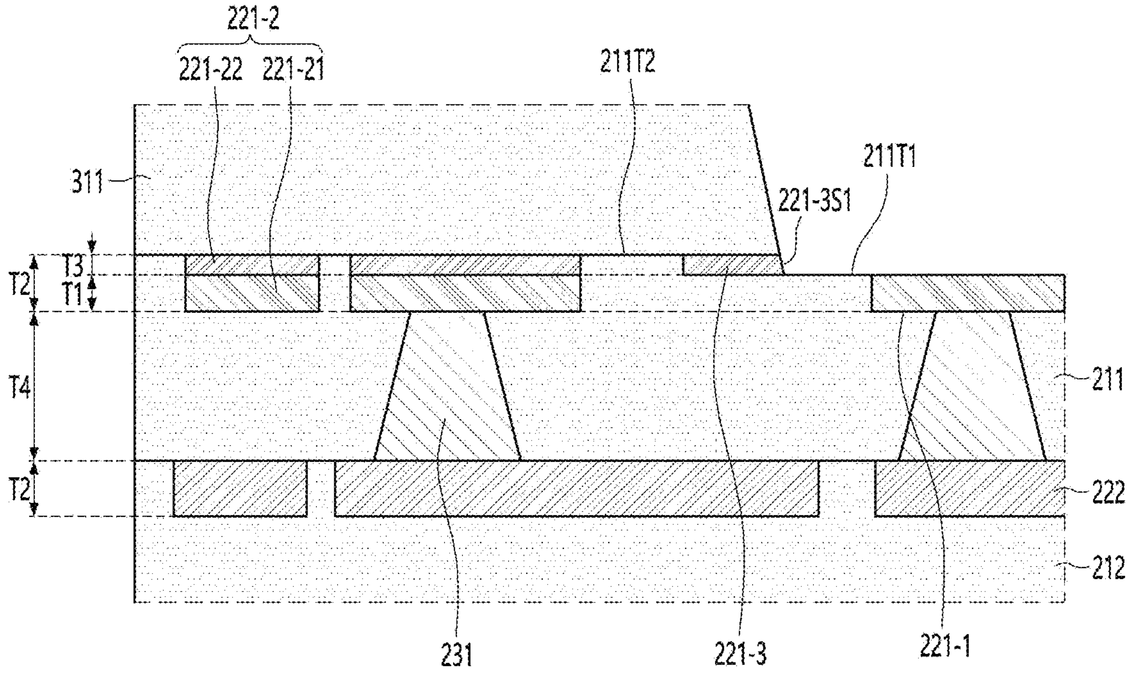

【FIG. 3C】
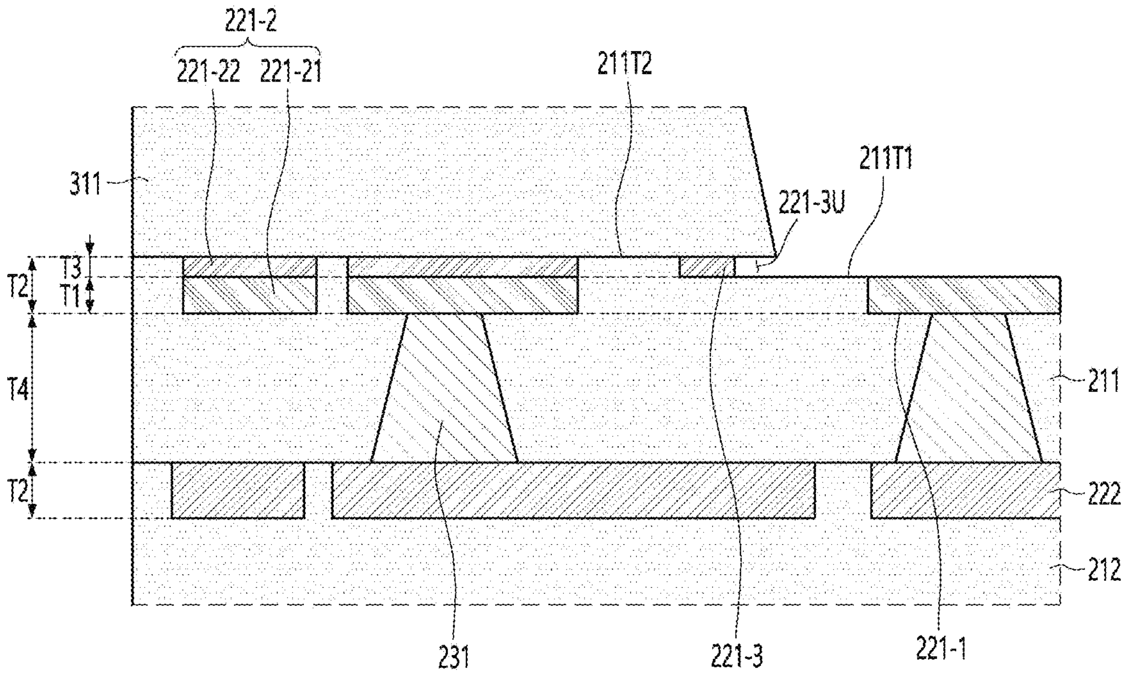

【FIG. 4A】
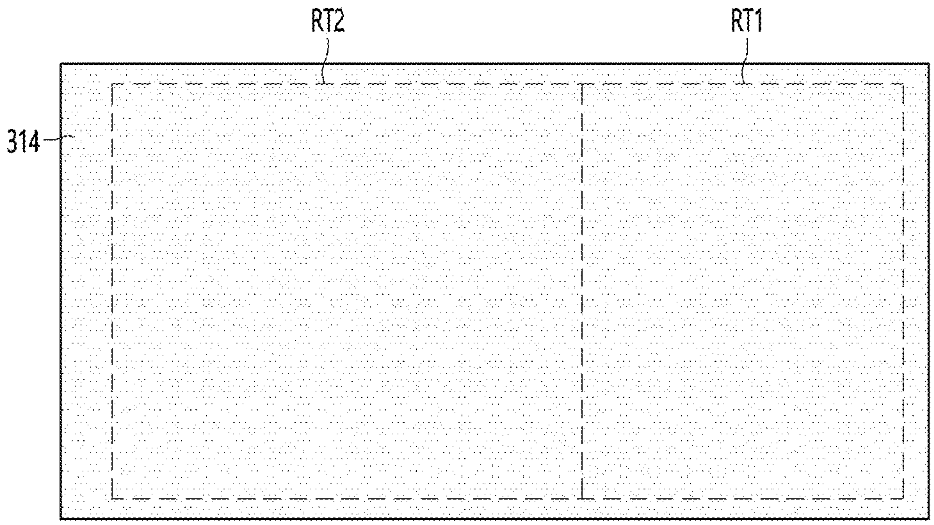
【FIG. 4B】
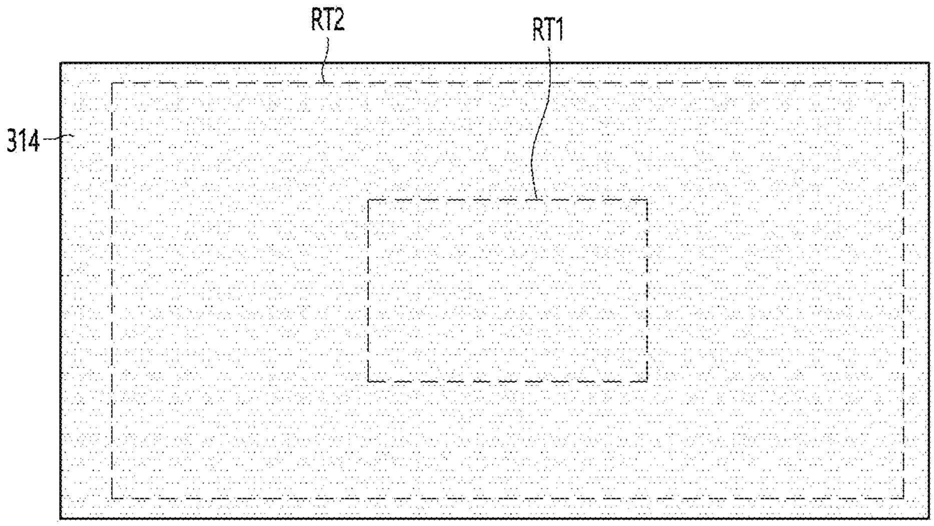

【FIG. 5A】
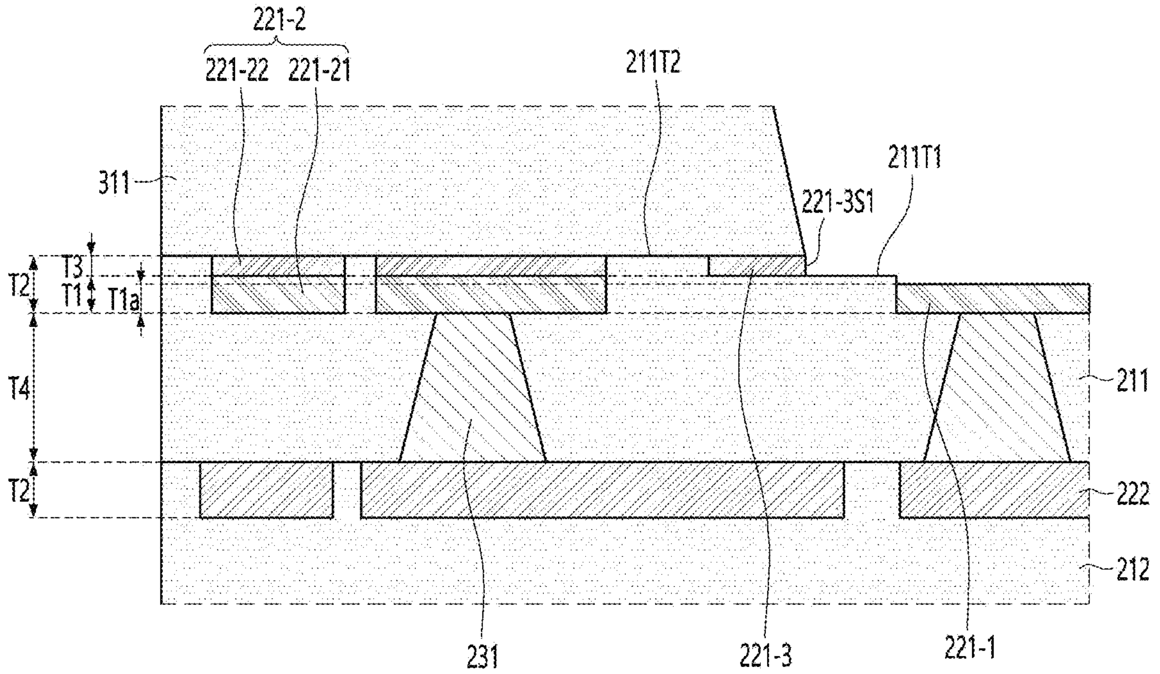

【FIG. 5B】
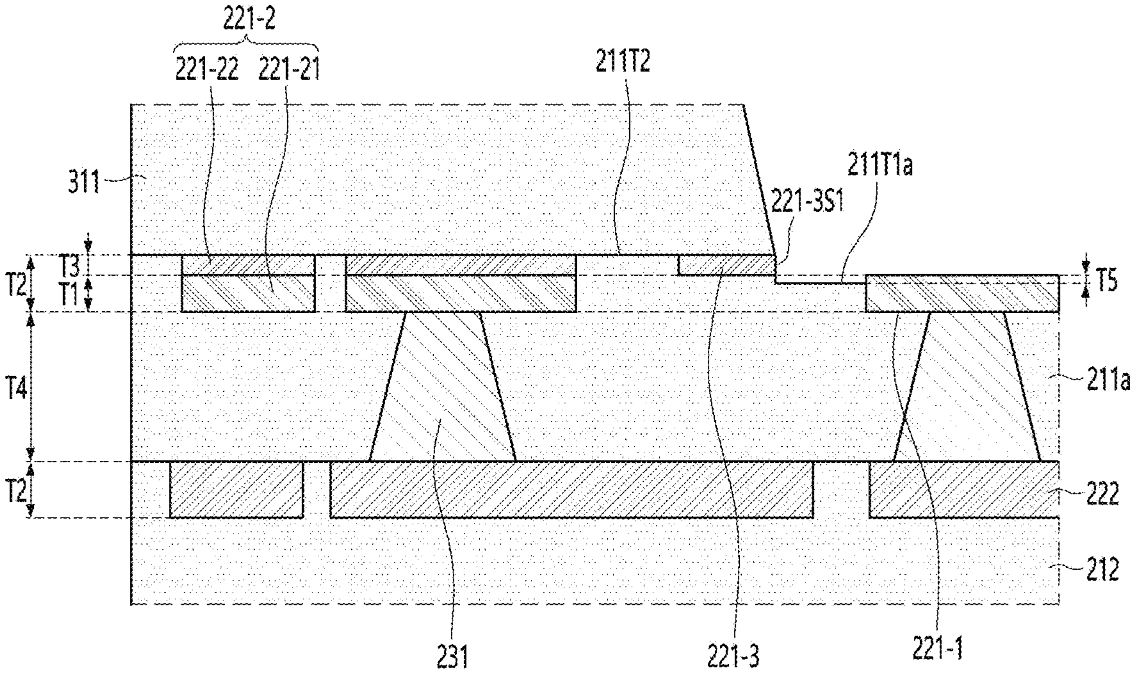

【FIG. 5C】
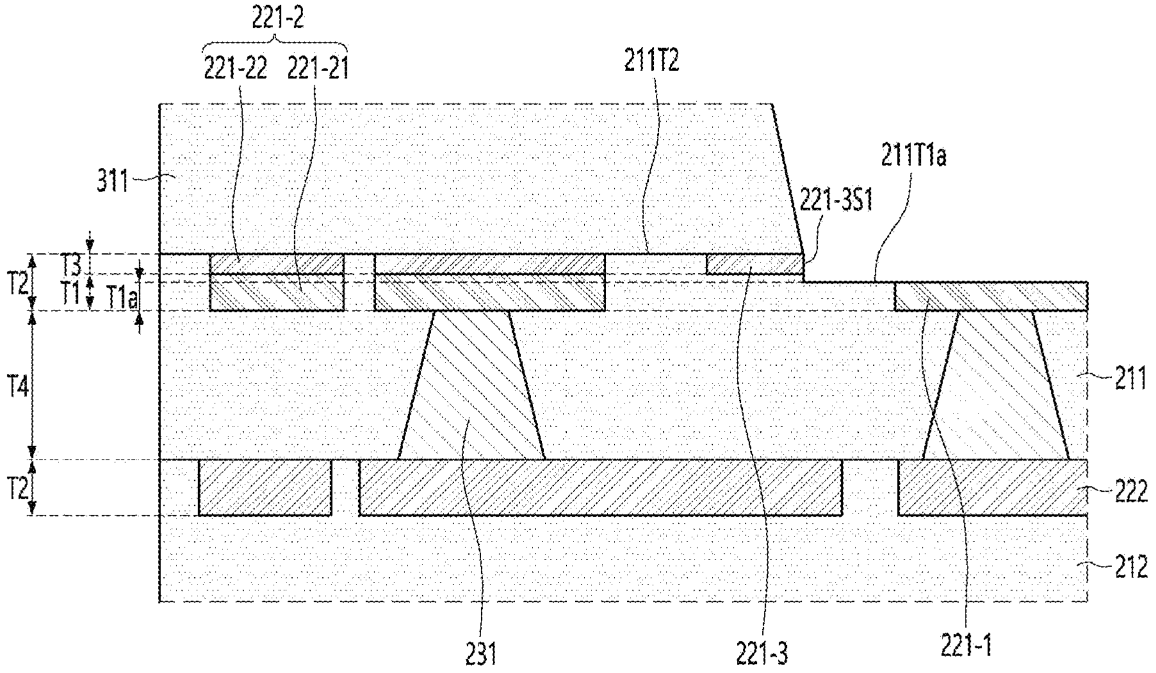

【FIG. 6】
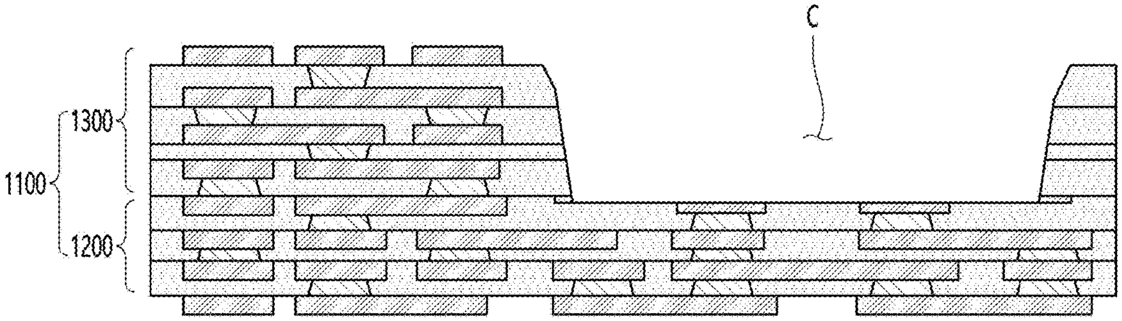
【FIG. 7】
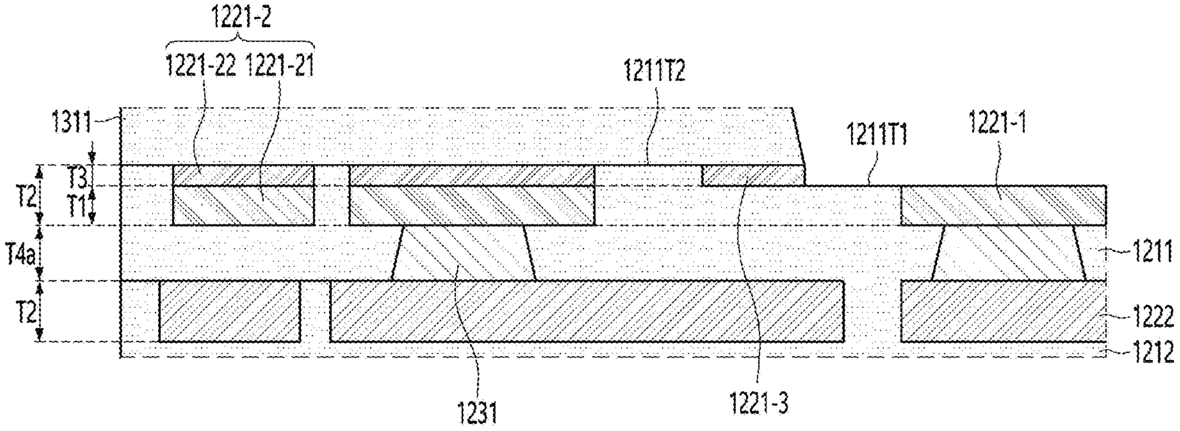

【FIG. 8】
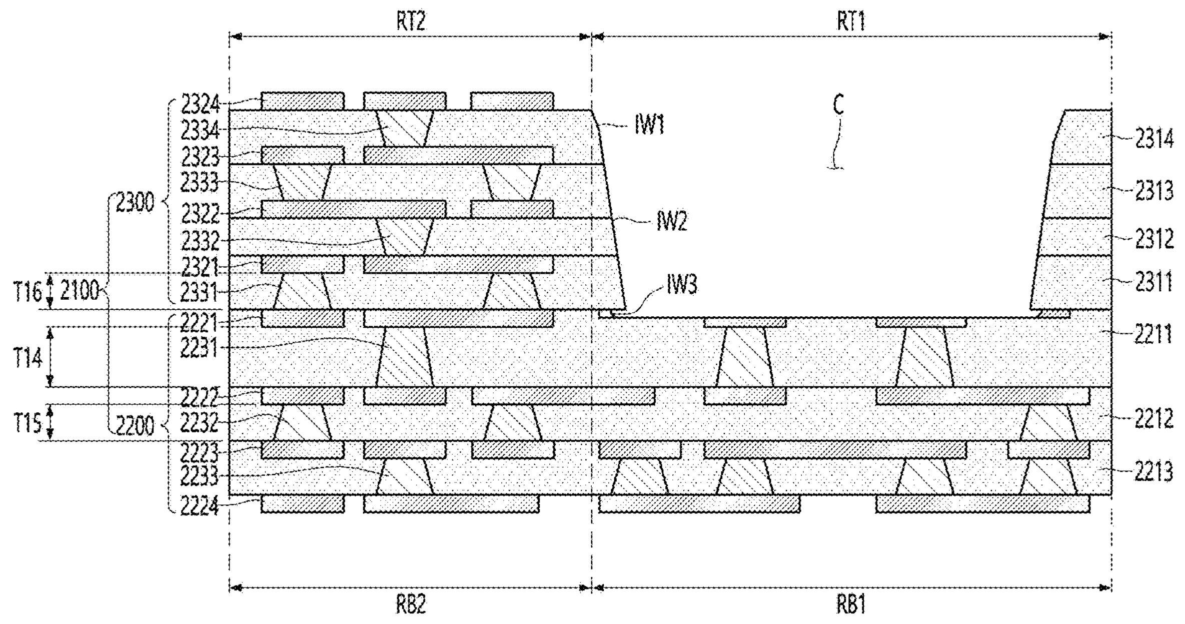
【FIG. 9】
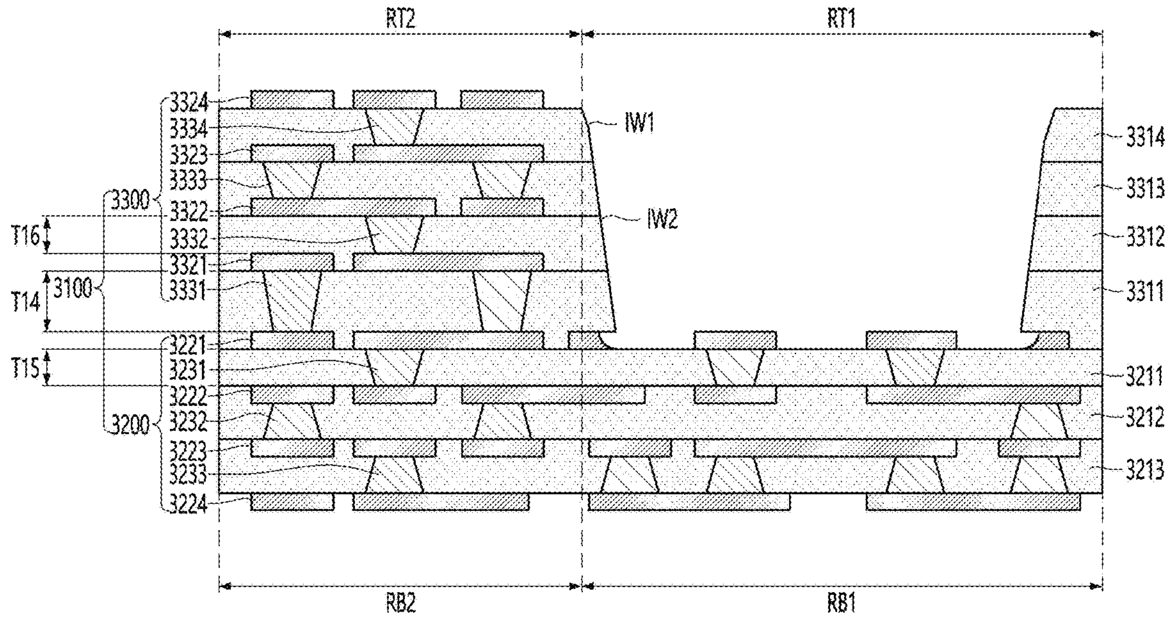

【FIG. 10】
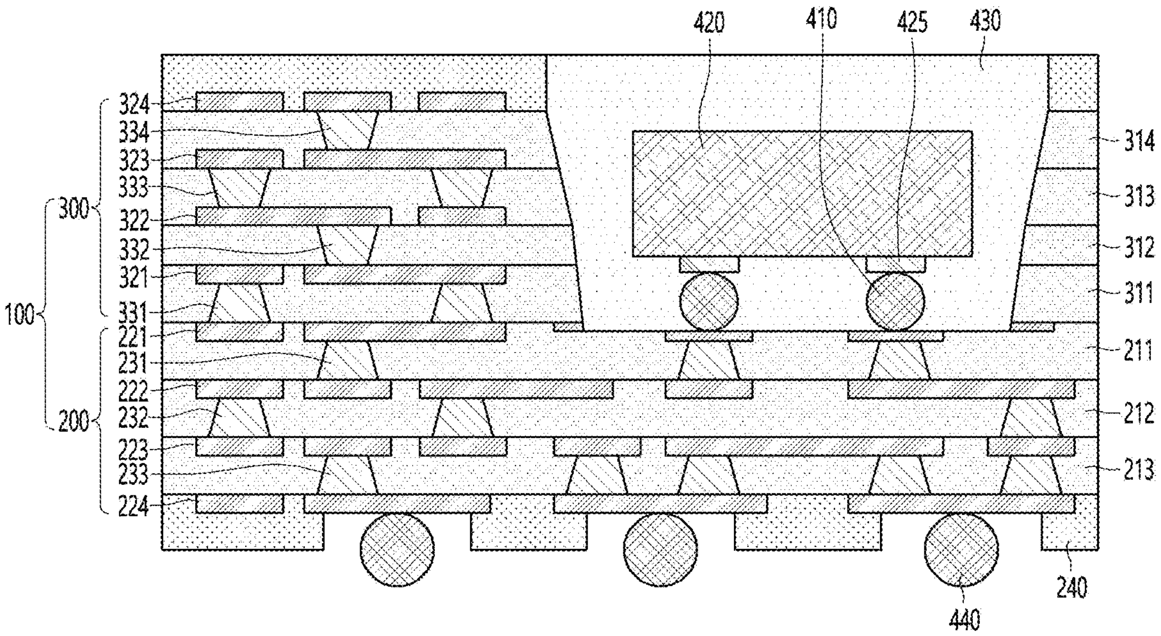
【FIG. 11A】
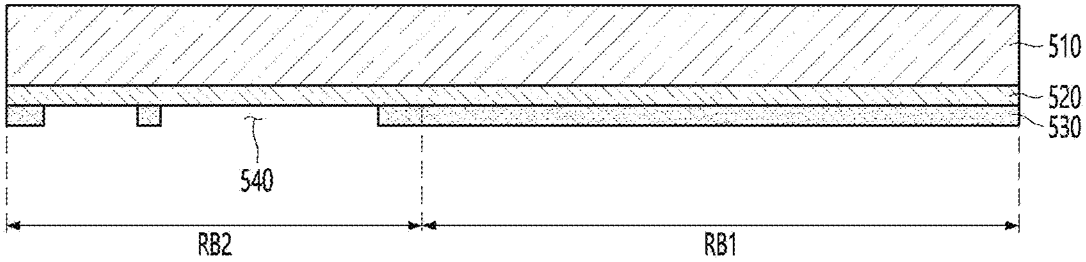

【FIG. 11B】
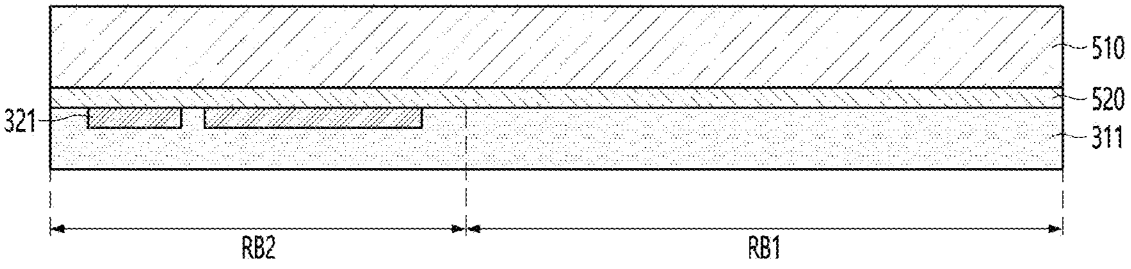
【FIG. 11C】
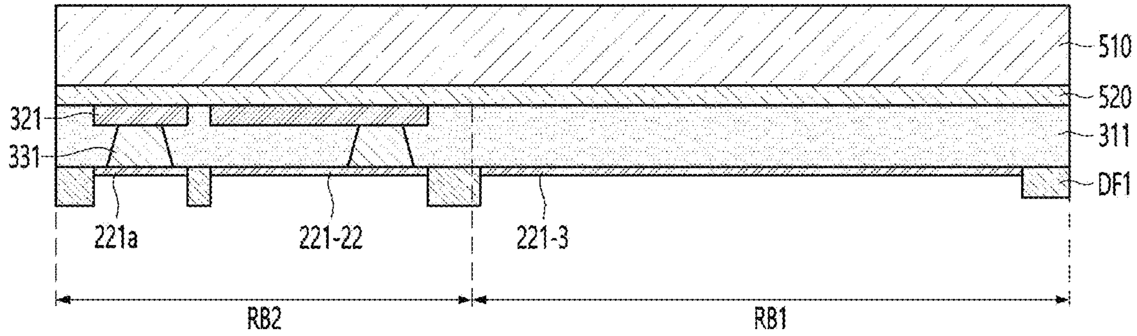
【FIG. 11D】
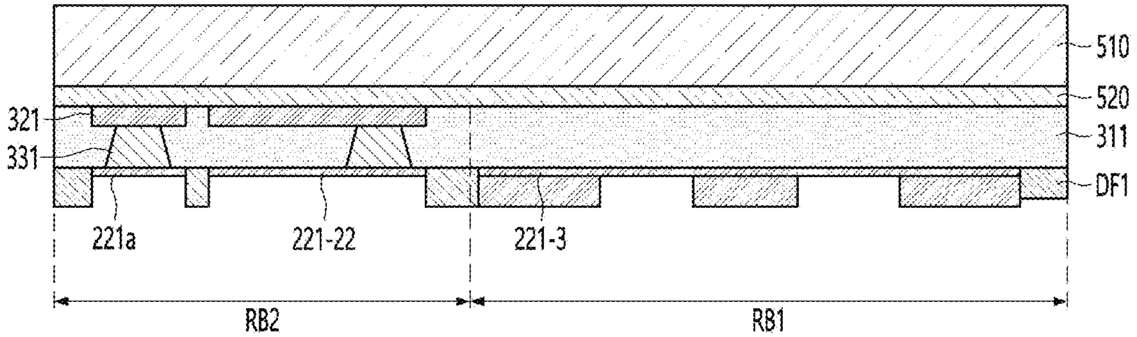

【FIG. 11E】
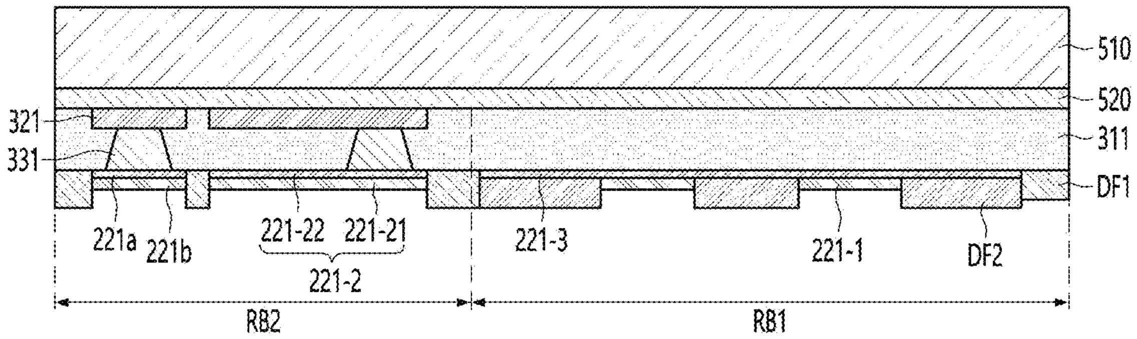
【FIG. 11F】
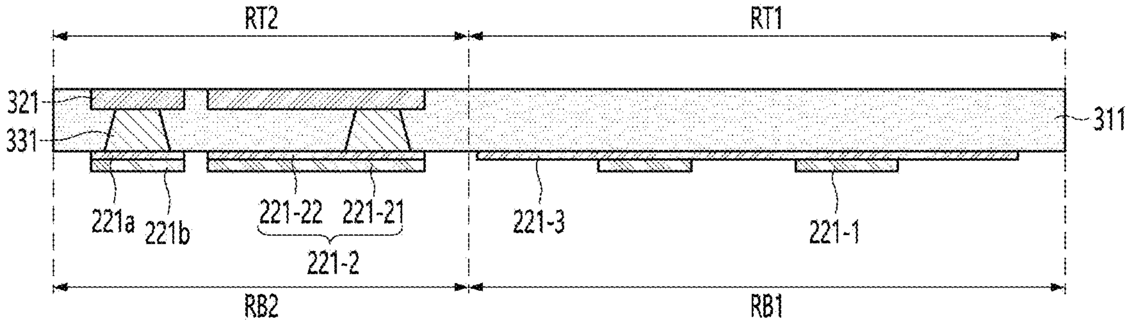

【FIG. 11G】
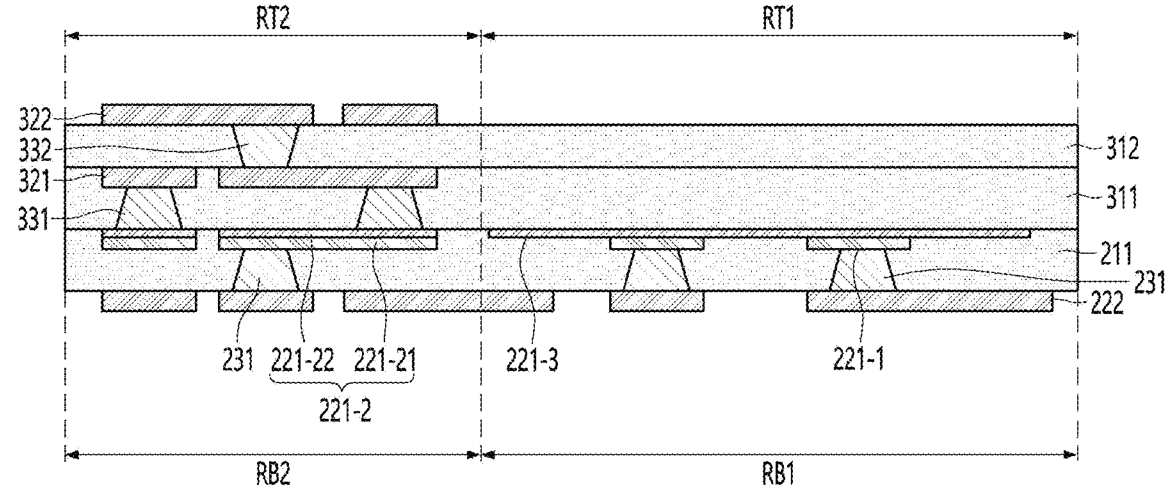
【FIG. 11H】
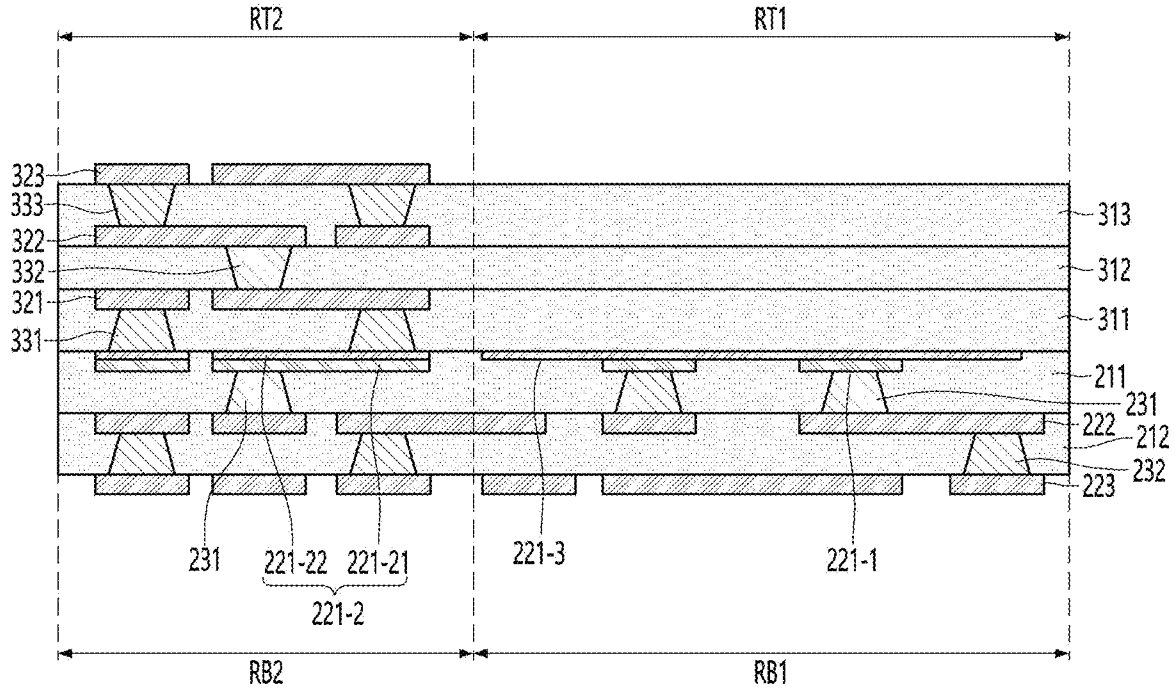

【FIG. 11I】
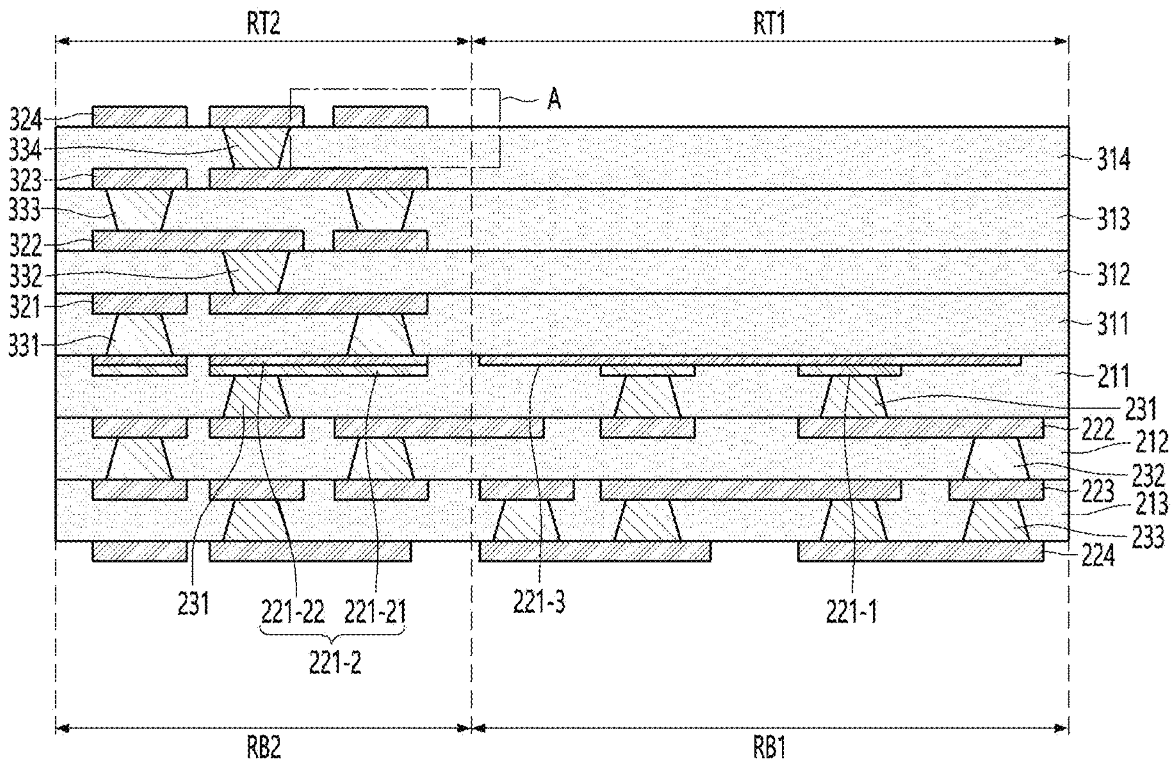

【FIG. 11J】
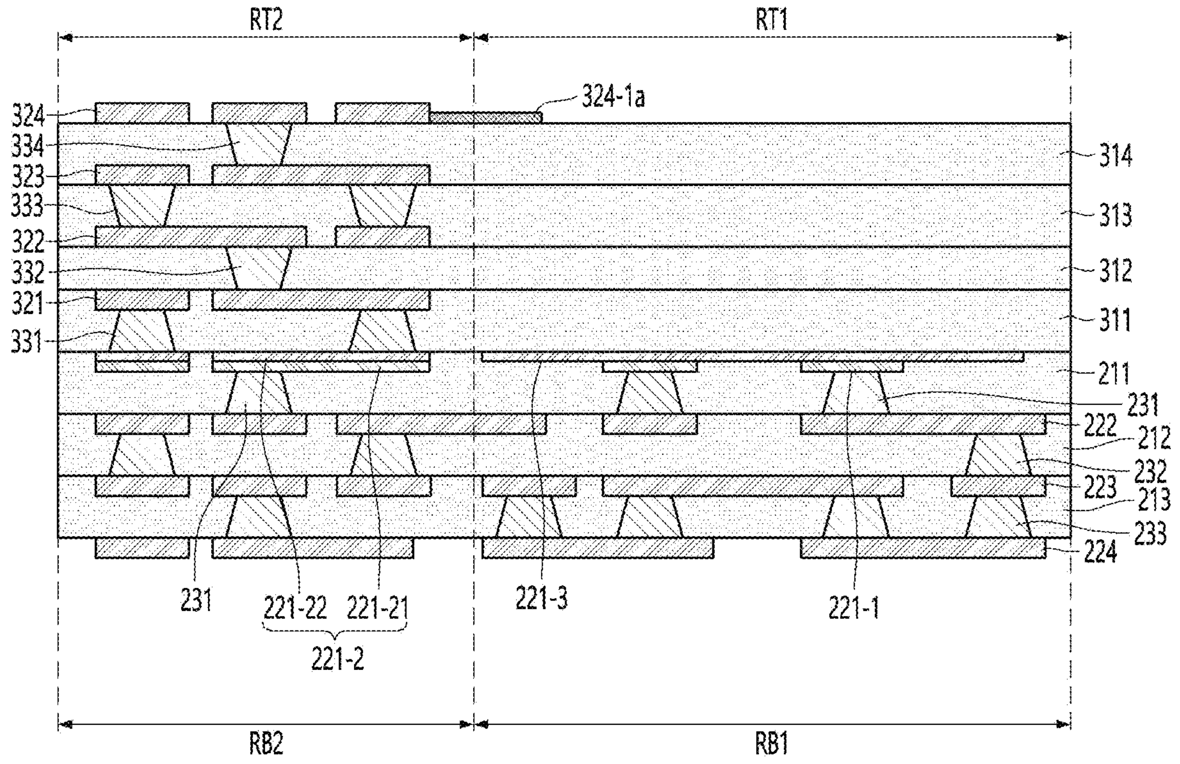
【FIG. 11K】
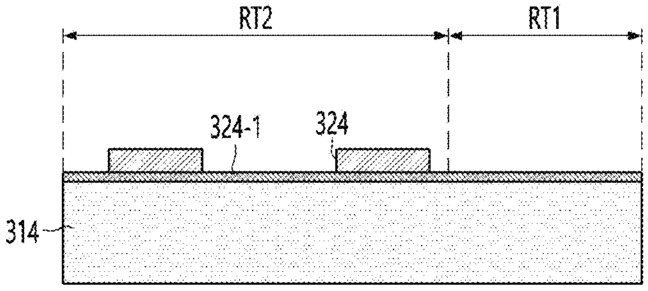

【FIG. 11L】
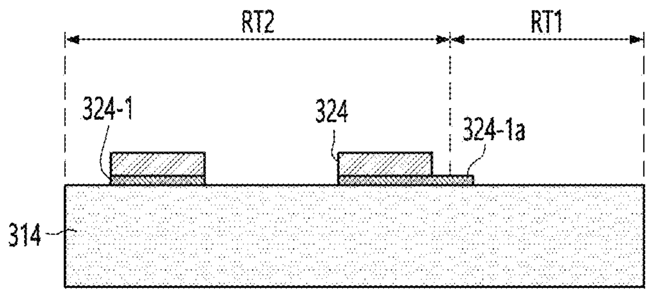
【FIG. 11M】
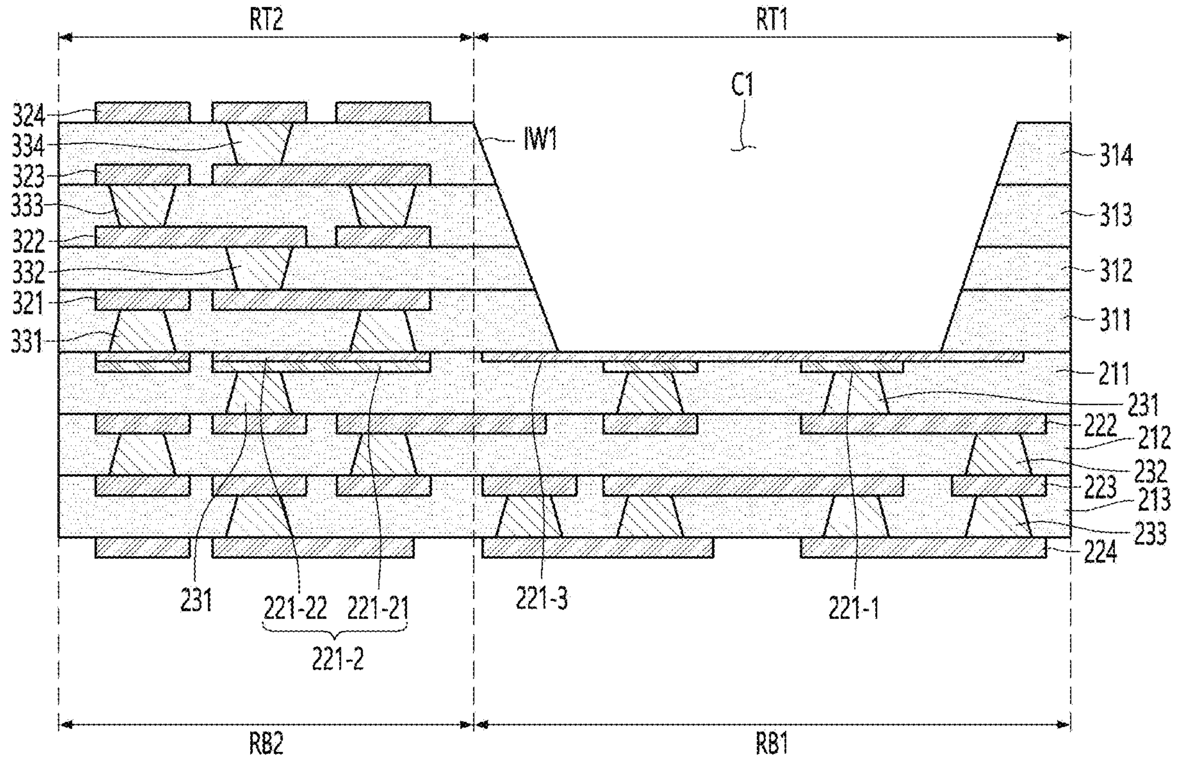

【FIG. 11N】
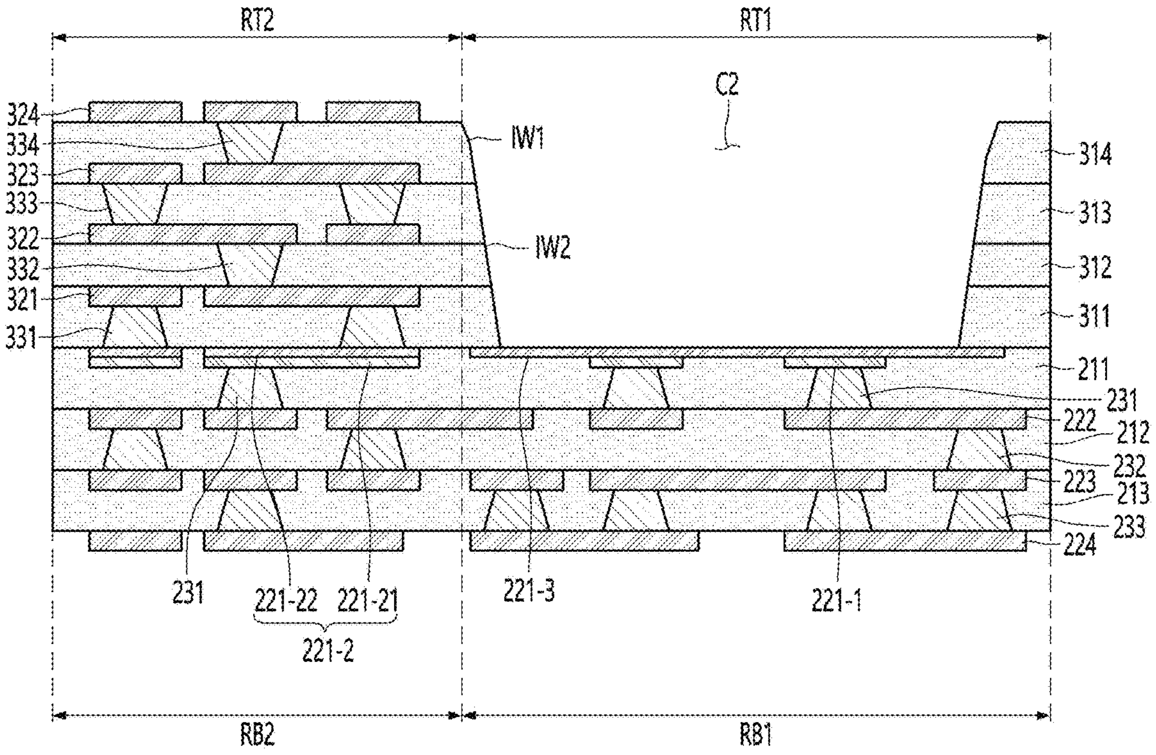
【FIG. 11O】
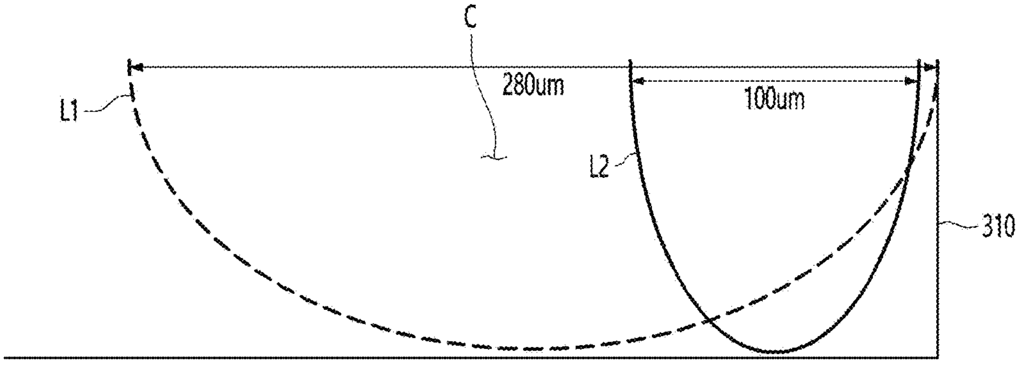

【FIG. 11P】
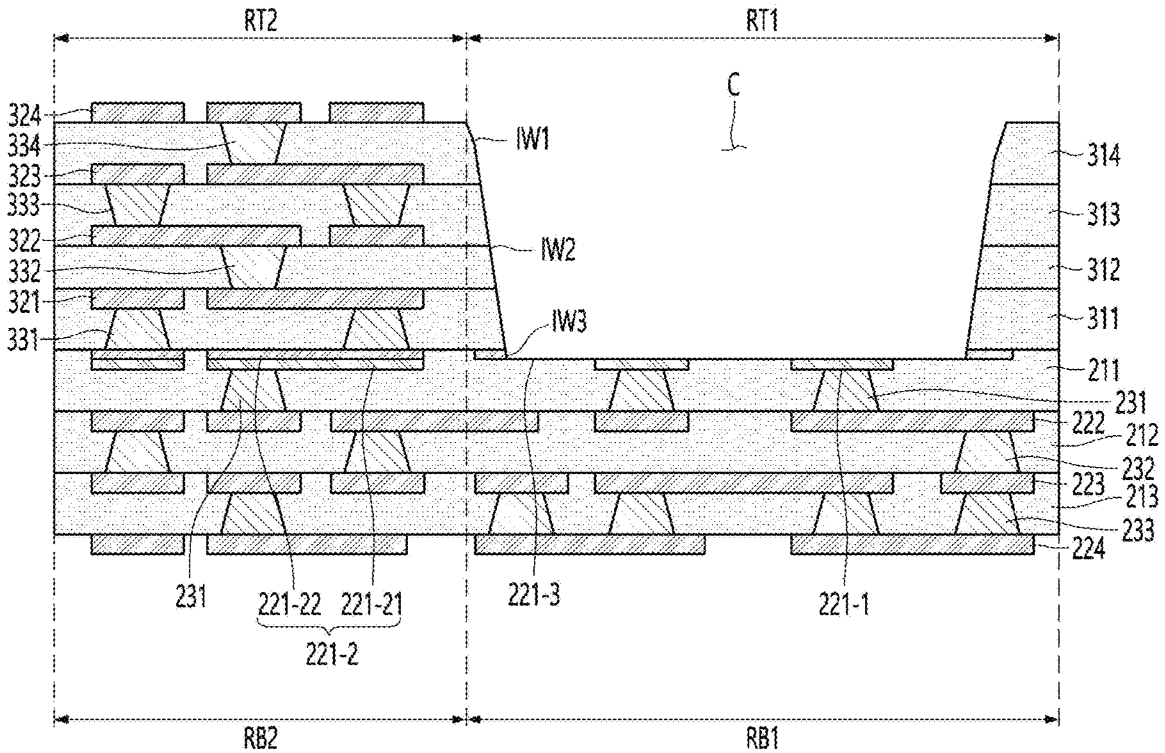

CIRCUIT BOARD WITH THREE SLOPED INNER WALLS

CROSS REFERENCE TO RELATED APPLICATIONS

This application is the National Phase of PCT International Application No. PCT/KR2022/019076, filed on Nov. 29, 2022, which claims priority under 35 U.S.C. 119(a) to Patent Application Nos. 10-2021-0167679, filed in the Republic of Korea on Nov. 29, 2021, and 10-2021-0170036, filed in the Republic of Korea on Dec. 1, 2021, all of which are hereby expressly incorporated by reference into the present application.

BACKGROUND

Technical Field

An embodiment relates to a circuit board, and more particularly, to a circuit board, a semiconductor package, and an antenna device including the same.

Discussion of the Related Art

A circuit board applied to a conventional 5G communication system has a structure in which a plurality of substrates are integrated. Thereby, the conventional circuit board has a relatively thick thickness. Accordingly, the conventional circuit board reduces an overall thickness by reducing a thickness of an insulating layer.

However, there is a limit to reducing the thickness of the insulating layer of the circuit board.

In addition, when the circuit board is applied to an antenna device, the circuit board includes an antenna unit corresponding to an antenna substrate or an antenna power supply substrate, and a driving unit corresponding to a transceiver substrate. In addition, the antenna unit and the driving unit have a structure that is arranged and coupled in a vertical direction to each other. In this case, an antenna pattern included in the antenna unit may radiate a signal in a vertical direction. Accordingly, when a thickness of the substrate corresponding to the antenna unit is reduced, mutual signal interference between the antenna unit and the driving unit may occur. As a result, there is a problem that radiation characteristics of the antenna pattern are deteriorated or the communication performance by the driving unit is reduced.

SUMMARY

An embodiment provides a circuit board having a new structure, a semiconductor package, and an antenna device including the same.

In addition, the embodiment provides a slimmed circuit board with minimal signal interference, a semiconductor package, and an antenna device including the same.

In addition, the embodiment provides a circuit board, a semiconductor package, and an antenna device that can minimize a distance of a signal line between a driving device and an antenna pattern.

In addition, the embodiment provides a circuit board, a semiconductor package, and an antenna device that can increase a depth of a cavity under a same condition.

In addition, the embodiment provide a circuit board, a semiconductor package, and an antenna device that can minimize space occupied by a cavity.

In addition, the embodiment provide a circuit board, a semiconductor package, and an antenna device that can prevent damage to a pad during a laser process.

In addition, the embodiment provides a circuit board, a semiconductor package, and an antenna device that can secure adhesion between multiple insulating layers.

In addition, the embodiment provides a circuit board, a semiconductor package, and an antenna devices that can secure adhesion to a molding layer for molding a semiconductor device.

Technical problems to be solved by the proposed embodiments are not limited to the above-mentioned technical problems, and other technical problems not mentioned may be clearly understood by those skilled in the art to which the embodiments proposed from the following descriptions belong.

A circuit board according to an embodiment comprises a first insulating layer; a first pattern layer disposed on an upper surface of the first insulating layer; and a second insulating layer disposed on the upper surface of the first insulating layer and an upper surface of the first pattern layer and including a cavity, wherein the upper surface of the first insulating layer includes a first upper surface corresponding to a lower surface of the cavity, and a second upper surface having a step difference from the first upper surface and not vertically overlapping the lower surface of the cavity, wherein the first pattern layer includes a first pattern part disposed on the first upper surface, and a second pattern part disposed on the second upper surface, and wherein a thickness of the first pattern part is smaller than a thickness of the second pattern part.

In addition, an upper surface of the first pattern part is positioned lower than an upper surface of the second pattern part.

In addition, a lower surface of the first pattern part is positioned on the same plane as a lower surface of the second pattern part.

In addition, the first pattern layer further includes a third pattern part disposed in a boundary region between the first upper surface and the second upper surface of the first insulating layer, and a thickness of the third pattern part is smaller than the thickness of the second pattern part.

In addition, an upper surface of the first pattern part is not in contact with the second insulating layer, and upper surfaces of the second and third pattern parts are in contact with the second insulating layer.

In addition, an upper surface of the third pattern part is positioned higher than an upper surface of the first pattern part, and a lower surface of the third pattern part is positioned higher than a lower surface of the second pattern part.

In addition, an upper surface of the third pattern part is positioned on the same plane as an upper surface of the second pattern part, and a lower surface of the third pattern part is positioned on the same plane or higher than an upper surface of the first pattern part.

In addition, the second pattern part includes a first metal layer horizontally overlapping the first pattern part; and a second metal layer disposed on the first metal layer and in contact with the second upper surface of the first insulating layer.

In addition, a thickness of the first metal layer of the second pattern part corresponds to the thickness of the first pattern part, and a thickness of the second metal layer of the second pattern part corresponds to a thickness of the third pattern part.

In addition, the first upper surface of the first insulating layer is positioned lower than the second upper surface.

In addition, the first upper surface of the first insulating layer is positioned lower than upper surfaces of the second pattern part and the third pattern part, and the second upper surface of the first insulating layer is positioned on the same plane as the upper surfaces of the second pattern part and the third pattern part.

In addition, the first upper surface of the first insulating layer is positioned on the same plane as the upper surface of the first pattern part or the lower surface of the third pattern part.

In addition, the first upper surface of the first insulating layer has a step difference from the upper surface of the first pattern part.

In addition, the first pattern part satisfies a range of 51% to 85% of the thickness of the second pattern part, and the third pattern part satisfies a range of 15% to 49% of the thickness of the second pattern part.

In addition, the circuit board comprises a second pattern layer disposed on the other surface of the first insulating layer, and a number of layers of the second pattern layer is different from a number of layers of the second pattern part of the first pattern layer.

In addition, the thickness of the second pattern part of the first pattern layer is the same as the thickness of the second pattern layer.

In addition, the circuit board comprises a first through electrode passing through the first insulating layer and connecting one of the first pattern part and the second pattern part of the first pattern layer to the second pattern layer, and a thickness of the first through electrode is less than or equal to a thickness of the second pattern part of the first pattern layer or a thickness of the second pattern layer.

In addition, the cavity includes a first part provided adjacent to an upper surface of the second insulating layer and having a first slope whose width changes toward the first insulating layer, and a second part provided adjacent to an upper surface of the second insulating layer and having a second slope different from the first slope whose width changes toward the first insulating layer, and the first slope with respect to an upper surface of the first pattern part is greater than the second slope with respect to the upper surface of the first pattern part.

In addition, a vertical length of the first part is smaller than a vertical length of the second part.

On the other hand, a semiconductor package according to the embodiment comprises a first insulating layer; a second insulating layer disposed on one surface of the first insulating layer and including a cavity; a first pattern layer disposed between the first insulating layer and the second insulating layer and having a first pattern part disposed in a first region vertically overlapping the cavity, a second pattern part disposed in a second region that does not vertically overlap the cavity, and a third pattern part disposed in a boundary region between the first and second regions; a second pattern layer disposed on the other surface of the first insulating layer; a third pattern layer disposed on the upper surface of the second insulating layer; a connection part disposed on the first pattern part of the first pattern layer; and a device mounted on the connection part, an upper surface of the first pattern part is positioned lower than upper surfaces of the second and third pattern parts, an upper surface of the second pattern part is positioned on the same plane as the upper surface of the third pattern part, a lower surface of the third pattern part is positioned higher than lower surfaces of the first and second pattern parts, and a lower surface of the first pattern part is positioned on the same plane as the lower surface of the second pattern part.

In addition, in the semiconductor package, the first to third pattern layers includes a first circuit part disposed in a region that does not vertically overlap the cavity, and a second circuit part disposed in a region vertically overlapping the cavity, the first circuit part is an antenna unit including an antenna pattern, the second circuit part is a driving unit for driving the antenna unit, and the device includes a driving device providing a transmission signal to the antenna unit or processing a reception signal received through the antenna unit.

A circuit board according to the embodiment includes a first insulating layer, a first pattern layer disposed on an upper surface of the first insulating layer, and a second insulating layer disposed on an upper surface of the first insulating layer and including a cavity, wherein a thickness of the first insulating layer is different from that of the second insulating layer, and a thickness of any one of the first and second insulating layers satisfies a range of 110% to 220% of the thickness of the other insulating layer.

In addition, the first pattern layer is disposed under the lower surface of the second insulating layer and buried in the first insulating layer, and the thickness of the first insulating layer is greater than the thickness of the second insulating layer.

In addition, the first pattern layer is disposed on the upper surface of the first insulating layer and buried in the second insulating layer, and the thickness of the second insulating layer is greater than the thickness of the first insulating layer.

In addition, the circuit board comprises a third insulating layer disposed under the first insulating layer, and a thickness of the third insulating layer is smaller than the thickness of the first insulating layer.

In addition, the thickness of the third insulating layer corresponds to the thickness of the second insulating layer.

In addition, the circuit board comprises a fourth insulating layer disposed on the second insulating layer, and a thickness of the fourth insulating layer is smaller than the thickness of the second insulating layer.

In addition, the thickness of the fourth insulating layer corresponds to the thickness of the first insulating layer.

In addition, the first pattern layer includes a pattern part in which an upper surface is in contact with the second insulating layer and a side surface is exposed through the cavity, and a width of a lower surface of the pattern part is greater than a width of an upper surface of the pattern part.

In addition, the pattern part includes a side surface having a slope whose width decreases from the lower surface of the pattern part toward the upper surface of the pattern part, and the side surface of the pattern part includes a curved surface.

In addition, the pattern part includes a concave portion recessed inward, at least a part of the lower surface of the second insulating layer vertically overlaps the concave portion and does not contact the first pattern layer and the first insulating layer.

In addition, one of the first and second insulating layers has a thickness in a range of 10 μm to 60 μm, and the other of the first and second insulating layers has a thickness in a range of 11 μm to 132 μm.

On the other hand, a package substructure according to the embodiment comprises a first insulating layer; a second insulating layer disposed on an upper surface of the first insulating layer and including a cavity; and a first pattern layer disposed between the first insulating layer and the second insulating layer and including a first pattern part disposed in a first region vertically overlapping the cavity, a second pattern part disposed in a second region that does not vertically overlap the cavity, and a third pattern part disposed in a boundary region between the first and second regions; a connection part disposed on the first pattern part; a device mounted on the connection part; and a molding layer molding the device and disposed in the cavity, wherein the third pattern part includes a concave portion recessed inward, at least a part of the lower surface of the second insulating layer vertically overlaps the concave portion and contacts the molding layer.

In addition, the third pattern part includes a side surface having a slope whose width decreases from a lower surface of the third pattern part toward an upper surface of the third pattern part, and the side surface of the third pattern part includes a curved surface.

In addition, the first pattern layer is disposed under the lower surface of the second insulating layer and buried in the first insulating layer, and the thickness of the first insulating layer satisfies a range of 110% to 220% of a thickness of the second insulating layer.

In addition, the first pattern layer is disposed on the upper surface of the first insulating layer and buried in the second insulating layer, and the thickness of the second insulating layer satisfies a range of 110% to 220% of the thickness of the first insulating layer.

Advantageous Effects

The circuit board of the embodiment may include a first substrate layer and a second substrate layer. The second substrate layer may include a cavity. The first substrate layer may include a first-first insulating layer disposed closest to the first substrate layer and a first pattern layer disposed on an upper surface of the first-first insulating layer. The first pattern layer may include a first pattern part disposed in a first region vertically overlapping the cavity, a second pattern part disposed in a second region that does not vertically overlap the cavity, and a third pattern part disposed in a boundary region between the first and second regions. A thickness of at least one of the first to third pattern parts may be different from a thickness of at least another of the first to third pattern parts. In addition, at least one of upper or lower surfaces of the first to third pattern parts may be positioned on a plane different from upper or lower surfaces of at least another of the first to third pattern parts. An embodiment may allow the first pattern layer disposed in the region adjacent to the cavity to have a structure in which different thicknesses or surfaces are disposed at different positions, thereby improving process characteristics of a process of forming the cavity. Accordingly, the embodiment may solve a reliability problem that may occur during a process of forming a cavity.

Specifically, the first pattern layer may have a two-layer structure including a first metal layer and a second metal layer through two-stage plating. In this case, one of the first metal layer and the second metal layer may be used as a first pattern part, which is a mounting pad, and the other one of the first metal layer and the second metal layer may be used as a third pattern part, which is a laser stopper. In addition, the second pattern part may include both the first and second metal layers. Accordingly, the embodiment may solve a reliability problem, which occurs when the mounting pad and the stopper are disposed on the same plane. For example, in a comparative example, in order to prevent the mounting pad from being damaged in a laser process of forming a cavity, a separate protective layer (not shown) is formed and removed from the mounting pad. On the contrary, in an embodiment, a part of the third pattern part used as the laser stopper may be used as a protection part of the first pattern part, which is the mounting pad. Accordingly, an embodiment may prevent the first pattern part, which is the mounting pad, from being damaged in the process of forming the cavity. In addition, the embodiment may omit a process of forming an additional protective layer for protecting the first pattern part.

In addition, the first substrate layer may include a first region vertically overlapping the cavity and a second region excluding the first region. In addition, the second substrate layer may include a third region corresponding to the cavity and a fourth region excluding the third region. In this case, the third region of the second substrate layer of the embodiment may be a region in which a driving device is disposed, and the fourth region may be a region in which an antenna pattern layer is disposed. Therefore, while a driving device is disposed using the cavity of the second substrate layer, the antenna pattern layer may be disposed in the fourth region of the second substrate layer adjacent to the driving device in a horizontal direction. Accordingly, in an embodiment, a signal transmission distance between the antenna pattern layer and the driving device may be minimized, and thus signal transmission loss may be minimized. For example, an embodiment may reduce a signal transmission distance compared to a structure in which a connection means of a comparative example is provided, and thus a signal transmission loss caused by a separate connection means may be reduced. In addition, the embodiment may have a structure in which the antenna pattern layer and the driving device are disposed in a horizontal direction. Accordingly, the embodiment may utilize the second region of the first substrate layer, which vertically overlaps the fourth region of the second substrate layer, as a second antenna pattern layer. Accordingly, it is possible to enable antenna pattern radiation and signal reception in different directions using one circuit pattern.

In addition, the embodiment may place a driving device in the cavity of the second substrate layer, thereby reducing the thickness of the circuit board to correspond to a depth of the cavity.

In addition, a cavity of the embodiment may include a first part having a first slope and a second part having a second slope different from the first slope. In this case, the second slope may have an inclination angle smaller than the first slope with respect to a lower surface of the cavity. In addition, a vertical length of the second part having the second slope of the embodiment may be longer than a vertical length of the first part having the first slope. Accordingly, the embodiment may reduce a space occupied by the cavity compared to the comparative example, thereby improving circuit integration. For example, the embodiment may increase a length of the antenna pattern layer within the same volume of the circuit board as the comparative example, and thus communication performance may be improved.

In addition, the embodiment may allow a thickness of a through electrode to have the same thickness as or less than that of the circuit layer. Accordingly, the thickness of the through electrode may be the same as that of the circuit layer or less than that of the circuit layer, and accordingly, a thickness of the circuit board may be reduced. In addition, the embodiment may reduce a signal transmission distance in a signal transmission path including the through electrode by reducing the thickness of the through electrode, thereby minimizing a signal transmission loss.

In addition, the embodiment can increase the number of layers of circuit layers by reducing thicknesses of the insulating layer and through electrode, thereby improving circuit integration and communication performance.

In addition, the first pattern layer may include a stopper layer for forming the cavity. The stopper layer may be removed after the cavity is formed. However, the stopper layer may be entirely disposed to correspond to a region in which the cavity is to be formed before the cavity is formed. In this case, a surface area of the first pattern layer in a process of manufacturing the circuit board may exceed 50% or 60% of a surface area of each of the first-first and second-first insulating layers, and thus, an adhesion between the first-first and second-first insulating layers may be deteriorated. The embodiment may increase a thickness of an insulating layer which is in contact with the first pattern layer including the stopper layer. Accordingly, the embodiment can improve an adhesion between the first pattern layer including the stopper layer and the insulating layer in contact with the first pattern layer. Specifically, a thickness of any one of the first-first and second-first insulating layers of the embodiment may be greater than a thickness of the other one of the first-first and second-first insulating layers. Accordingly, the embodiment may improve an adhesion between the first pattern layer, the first-first and the second-first insulating layers, thereby improving physical reliability of the circuit board.

BRIEF DESCRIPTION OF THE DRAWINGS

FIG. 1 is a view illustrating a circuit board according to a first embodiment.

FIG. 2 is an enlarged view of a cavity region of FIG. 1.

FIG. 3A is an enlarged view of an arrangement region of a first pattern layer of a circuit board according to a first embodiment.

FIG. 3B is an enlarged view of an arrangement region of a first pattern layer of a circuit board according to a second embodiment.

FIG. 3C is an enlarged view of an arrangement region of a first pattern layer of a circuit board according to a third embodiment.

FIGS. 4A and 4B are top plan views of the second substrate layer.

FIG. 5A is a view illustrating a circuit board according to a first modified example.

FIG. 5B is a view illustrating a circuit board according to a second modified example.

FIG. 5C is a view illustrating a circuit board according to a third modified example.

FIG. 6 is a view illustrating a circuit board according to a second embodiment.

FIG. 7 is an enlarged view of a partial region of FIG. 6.

FIG. 8 is a view illustrating a semiconductor package according to an embodiment.

FIG. 9 is a view illustrating a circuit board according to a third embodiment.

FIG. 10 is a view illustrating a circuit board according to a fourth embodiment.

FIGS. 11A to 11P are views showing a method of manufacturing a circuit board according to an embodiment shown in FIG. 1 in order of processes.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and redisposed.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in “at least one (or more) of A (and), B, and C”.

Further, in describing the elements of the embodiments of the present invention, the terms such as first, second, A, B, (a), and (b) may be used. These terms are only used to distinguish the elements from other elements, and the terms are not limited to the essence, order, or order of the elements. In addition, when an element is described as being “connected”, “coupled”, or “contacted” to another element, it may include not only when the element is directly “connected” to, “coupled” to, or “contacted” to other elements, but also when the element is “connected”, “coupled”, or “contacted” by another element between the element and other elements.

In addition, when described as being formed or disposed “on (over)” or “under (below)” of each element, the “on (over)” or “under (below)” may include not only when two elements are directly connected to each other, but also when one or more other elements are formed or disposed between two elements. Further, when expressed as “on (over)” or “under (below)”, it may include not only the upper direction but also the lower direction based on one element.

Before describing an embodiment, the antenna device of the comparative example will be briefly described.

An antenna device of the comparative example includes a first board and a second board manufactured through separate processes. The first board and the second board are coupled through a connection member such as a solder ball. The first board includes an antenna pattern functioning as an antenna, and the second board includes a driving device driving the antenna pattern.

In the comparative example, a thickness of the antenna device may increase by a thickness of the connection member.

In addition, in the comparative example, the first board and the second board are coupled with a vertical stacked structure, and accordingly, the signal transmission length between the antenna pattern and the driving device may increase, and the signal transmission loss may increase corresponding to the signal transmission length.

In addition, in the comparative example, the first board and the second board are connected by applying a connector structure using a flexible circuit board instead of the connection member. When the flexible circuit board is used, the first board and the second board may have a horizontal arrangement structure. However, the signal transmission distance may increase by a length of the flexible circuit board, and accordingly, signal loss may increase.

Meanwhile, antenna devices applied to 5G communication systems transmit and receive more data than antenna devices applied to communication systems of 4G or less. In this case, the battery consumption of the antenna device may increase in proportion to the amount of data transmitted and received from the antenna device, and accordingly, the battery capacity is increasing. Also, a battery size may increase in proportion to the battery capacity, and a space occupied by the battery in the antenna device is increasing.

Meanwhile, communication systems of 5G or higher are reducing a thickness of an insulating layer or a thickness of an antenna pattern provided on a circuit board to maintain a size of an antenna device (e.g., a mobile terminal) while increasing a size of a battery. In this case, if the thickness of the antenna pattern decreases, an allowable current of the antenna pattern may decrease. Here, the allowable current means a limit value of a current through which a stable signal may flow corresponding to a cross-sectional area of the antenna pattern. If the thickness of the antenna pattern decreases, there is a problem in that the allowable current decreases and thus communication performance (e.g., communication speed, transmission signal strength, reception signal strength) decreases.

In addition, if the thickness of the insulating layer decreases, the distance between the first board and the second board may decrease, increasing signal interference between them, resulting in communication performance problems such as communication errors.

A circuit board, a semiconductor package, and an antenna device including the same according to an embodiment will be described in detail.

FIG. 1 is a view illustrating a circuit board according to a first embodiment, and FIG. 2 is an enlarged view of a cavity region of FIG. 1.

Hereinafter, an overall structure of the circuit board according to an embodiment will be described with reference to FIGS. 1 and 2.

First, the circuit board 100 of the embodiment may be used as a substrate of an antenna device. However, the embodiment is not limited thereto. For example, the circuit board of the embodiment may be applied to a semiconductor package other than the antenna device while at least one semiconductor device may be mounted. For example, a structural semiconductor package in which a semiconductor device is mounted on a circuit board of the embodiment may be applied to an electronic device. In this case, the electronic device includes a main board (not shown). The main board may be physically and/or electrically connected to various components. For example, the main board may be connected to the semiconductor package of the embodiment. Various semiconductor devices may be mounted on the semiconductor package. The semiconductor package may include memory chips such as volatile memory (e.g., DRAM), non-volatile memory (e.g., ROM), and flash memory, application processor chips such as central processors (e.g., CPUs), graphics processors (e.g., GPUs), digital signal processors, encryption processors, microprocessors, and microcontrollers, and logic chips such as analog-to-digital converters and application-specific ICs (ASICs).

The circuit board according to an embodiment may include a cavity so that at least one semiconductor element may be mounted in the cavity. For example, the semiconductor element may be an RFIC including a transmission chip and a reception chip of an antenna device, but is not limited thereto.

The electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, it will be described that the circuit board of the embodiment is used as a semiconductor package applied to an antenna device.

The circuit board 100 of an embodiment may be provided for driving, feeding, and supporting an antenna unit. For example, the circuit board 100 may be a printed circuit board (PCB). Such a circuit board 100 has a flat plate structure. The circuit board 100 may have a multilayer structure in which a plurality of layers are stacked.

The circuit board 100 may include a ground layer (not shown) for grounding and a feeding part (not shown) for feeding power.

The circuit board 100 of an embodiment may be divided into an antenna unit in which a conductive antenna pattern layer is disposed and a driving unit in which a driving device for driving the antenna unit is disposed. The conductive antenna pattern layer may mean any one of a plurality of circuit layers to be described below. The conductive antenna pattern layer may be provided for signal transmission and reception in the circuit board of an embodiment. For example, the conductive antenna pattern layer may transmit and receive signals in a predetermined resonant frequency band. For example, the conductive antenna pattern layer may be operated in a resonant frequency band to transmit and receive electromagnetic waves. The conductive antenna pattern layer may operate as power is supplied from a power supply unit (not shown) of the circuit board 100, and a power supply operation of the power supply unit may be performed under the control of the driving unit.

The circuit board 100 according to an embodiment may include a first substrate layer 200 and a second substrate layer 300. The first substrate layer 200 and the second substrate layer 300 may be obtained by dividing one circuit board into a plurality of regions based on a thickness direction. For example, the first substrate layer 200 and the second substrate layer 300 may be obtained by dividing the circuit board 100 based on a first substrate region in which a cavity C is formed and a second substrate region other than the first substrate region.

The first substrate layer 200 may include one layer of insulating layer and two or more layers of insulating layer.

The second substrate layer 300 may be disposed on the first substrate layer 200. The second substrate layer 300 may include two or more insulating layers. The second substrate layer 300 may include a circuit layer and a cavity C. The circuit layer of the second substrate layer 300 may be a conductive antenna pattern layer functioning as an antenna.

When the second substrate layer 300 includes one layer of insulating layer, a depth of the cavity C provided in the second substrate layer 300 may not be sufficiently secured, and thus an effect of reducing the thickness of the semiconductor package may be insufficient. In addition, when the second substrate layer 300 includes one layer of insulating layer, communication performance by the antenna pattern may be deteriorated.

Hereinafter, the first substrate layer 200 and the second substrate layer 300 according to an embodiment will be described in detail.

The first substrate layer 200 may include an insulating layer, a circuit layer, and a through electrode. The through electrode may also be referred to as a 'connecting part' or a 'via' that functions to connect circuit patterns disposed on different layers.

The first substrate layer 200 may include a first insulating layer. The first insulating layer may have a layer structure of one layer or two or more layers. Although the first insulating layer of the first substrate layer 200 is shown to have a three-layer structure, the embodiment is not limited thereto.

The first insulating layer may include a first-first insulating layer 211, a first-second insulating layer 212, and a first-third insulating layer 213. For example, the first insulating layer may include a first-first insulating layer 211, a first-second insulating layer 212, and a first-third insulating layer 213 disposed in order from a region adjacent to the second substrate layer 300.

The first-first insulating layer 211 may mean a first uppermost insulating layer disposed closest to the second substrate layer 300 among the first insulating layers. Also, the first-third insulating layer 213 may mean a first lowermost insulating layer farthest from the second substrate layer 300 among the first insulating layers. Also, the first-second insulating layer 212 may mean a first inner insulating layer disposed between the first uppermost insulating layer and the first lowermost insulating layer. And, when the first substrate layer 200 has an insulating layer structure of four or more layers, the first inner insulating layer may be formed of a plurality of layers.

The first insulating layer may include a prepreg (PPG), but is not limited thereto.

For example, if the first insulating layer includes a plurality of layers, a at least one of the plurality of layers may include a prepreg, and the remaining portion of the plurality of layers may include an insulating material other than prepreg.

Each of the first-first insulating layer 211, the first-second insulating layer 212, and the first-third insulating layer 213 of the first insulating layer may have a thickness in a range of 10 μm to 60 μm. For example, each of the first-first insulating layer 211, the first-second insulating layer 212, and the first-third insulating layer 213 may have a thickness in a range of 12 μm to 45 μm. For example, each of the first-first insulating layer 211, the first-second insulating layer 212, and the first-third insulating layer 213 may have a thickness of 15 μm to 30 μm.

Each thickness of the first-first insulating layer 211, the first-second insulating layer 212, and the first-third insulating layer 213 may mean a vertical distance between different circuit layers adjacent to each other. When the thickness of each of the first-first insulating layer 211, the first-second insulating layer 212, and the first-third insulating layer 213 is less than 10 μm, a distance between different circuit layers corresponding thereto becomes close, and thus may be weakened to noise due to signal interference therebetween. When each thickness of the first-first insulating layer 211, the first-second insulating layer 212, and the first-third insulating layer 213 exceeds 60 μm, the thickness of the circuit board may increase. Also, when each thickness of the first-first insulating layer 211, the first-second insulating layer 212, and the first-third insulating layer 213 exceeds 60 μm, the thickness of the through electrode may also increase, and accordingly, the signal transmission distance may increase, thereby increasing signal transmission loss.

The first substrate layer 200 according to an embodiment may include a first circuit layer. For example, the first substrate layer 200 may include first circuit layers disposed on a plurality of insulating layers of the first insulating layer, respectively.

For example, the first substrate layer 200 may include a first pattern layer 221 disposed on an upper surface of the first-first insulating layer 211. For example, the first substrate layer 200 may include a second pattern layer 222 disposed between the lower surface of the first-first insulating layer 211 and an upper surface of the first-second insulating layer 212. For example, the first substrate layer 200 may include a third pattern layer 223 disposed between a lower surface of the first-second insulating layer 212 and an upper surface of the first-third insulating layer 213. For example, the first substrate layer 200 may include a fourth pattern layer 224 disposed on a lower surface of the first-third insulating layer 213.

The first pattern layer 221 may be disposed in the first-first insulating layer 211. For example, at least a portion of a side surface of the first pattern layer 221 may be covered by the first-first insulating layer 211. Preferably, at least a portion of a side surface and a lower surface of the first pattern layer 221 may be covered by the first-first insulating layer 211 without being in contact with the first insulating layer.

The first pattern layer 221 may refer to a circuit layer disposed at an uppermost side of the circuit layers of the first substrate layer.

The first pattern layer 221 may have different heights depending on a position. For example, a height of an upper surface of at least one of the plurality of pattern parts may be different from a height of an upper surface of at least another one of the plurality of pattern parts. For example, an upper surface of at least one of a plurality of pattern parts of the first pattern layer 221 may have a step difference from an upper surface of at least another one of the plurality of pattern parts. In addition, a lower surface of at least one of a plurality of pattern parts of the first pattern layer 221 may have a different height or step difference from a lower surface of at least another one of the plurality of pattern parts. In addition, a thickness of at least one of a plurality of pattern parts of the first pattern layer 221 may be different from a thickness of at least another one of the plurality of pattern parts of the first pattern layer 221.

For example, the first substrate layer 200 may be divided into a plurality of regions in a width direction or a length direction.

The first substrate layer 200 may include a first region RB1 that vertically overlaps the cavity C and a second region RB2 other than the first region RB1. In this case, the cavity C may include a region whose width changes in a thickness direction. The first region RB1 may mean a region that vertically overlaps a region having a largest width among the entire regions of the cavity C. However, an embodiment is not limited thereto. For example, the first region RB1 may mean a region that vertically overlaps a region having the smallest width among the entire regions of the cavity C. For example, the first region RB1 may mean a region that vertically overlaps a region having a smallest width among the entire regions of the cavity C. For example, the first region RB1 may mean a region that vertically overlaps a region between an upper region and a lower region of the cavity C.

The first pattern layer 221 may include a plurality of pattern parts. For example, the first pattern layer 221 may include a first pattern part 221-1 disposed on an upper surface of the first region RB1 of the first-first insulating layer 211. For example, the first pattern layer 221 may include a second pattern part 221-2 disposed on an upper surface of the second region RB2 of the first-first insulating layer 211. Also, the first substrate layer 200 includes a boundary region between the first region RB1 and the second region RB2. The boundary region may overlap at least a portion of the first region RB1 and/or the second region RB2. The boundary region may mean a region vertically overlapping at least a portion of an inner wall of the cavity C. The first pattern layer 221 may include a third pattern part 221-3 disposed in the boundary region.

In this case, a thickness of at least one of the first to third pattern parts 221-1, 221-2, and 221-3 of the first pattern layer 221 may be different from a thickness of at least another one of the first to third pattern parts 221-1, 221-2, and 221-3 of the first pattern layer 221. In addition, an upper surface of at least one of the first to third pattern parts 221-1, 221-2, and 221-3 of the first pattern layer 221 may be positioned in a plane different from an upper surface of at least another one of the first to third pattern parts 221-1, 221-2, and 221-3 of the first pattern layer 221. In addition, a lower surface of at least one of the first to third pattern parts 221-1, 221-2, and 221-3 of the first pattern layer 221 may be positioned in a plane different from a lower surface of at least another one of the first to third pattern parts 221-1, 221-2, and 221-3 of the first pattern layer 221.

Preferably, the upper surface of the first pattern part 221-1 may be positioned lower than an upper surface of the second pattern part 221-2 and an upper surface of the third pattern part 221-3. The first pattern part 221-1 may function as a mounting pad on which a semiconductor device is mounted. In this case, the first pattern part 221-1 may be positioned lower than the second pattern part 221-2 and the third pattern part 221-3, thereby preventing the first pattern part 221-1 from being damaged in a laser process for forming the cavity C. Accordingly, an embodiment may improve reliability in a mounting process of the semiconductor device.

Meanwhile, the first circuit layer including the first pattern layer 221, the second pattern layer 222, the third pattern layer 223, and the fourth pattern layer 224 may be formed of at least one metal material selected from gold (Au), silver (Ag), platinum (Pt), titanium (Ti), tin (Sn), copper (Cu), and zinc (Zn). The first circuit layers may be formed of a paste or a solder paste including at least one metal material selected from among gold (Au), silver (Ag), platinum (Pt), titanium (Ti), tin (Sn), copper (Cu), and zinc (Zn) having excellent bonding strength. Preferably, the first circuit layer may be formed of copper (Cu) which has high electrical conductivity and is relatively inexpensive.

Each pattern layer of the first circuit layer may have a thickness in a range of 5 μm to 50 μm. For example, each pattern layer of the first circuit layer may have a thickness in a range of 10 μm to 40 μm. For example, each pattern layer of the first circuit layer may have a thickness in a range of 15 μm to 30 μm. When a thickness of each pattern layer of the first circuit layer is less than 5 μm, a resistance of the circuit layer may increase, and thus the signal transmission loss may increase. When the thickness of each pattern layer of the first circuit layer is less than 5 μm, an allowable current of a signal that may be transmitted to the first circuit layer may decrease, and thus communication performance such as a decrease in a signal transmission speed may deteriorate. Also, when the thickness of each pattern layer of the first circuit layer exceeds 50 μm, a line width of the pattern part may increase, thereby making it difficult to miniaturize. Also, when the thickness of each pattern layer of the first circuit layer exceeds 50 μm, a thickness of the circuit board may increase.

Meanwhile, the first substrate layer 200 may include a through part. For example, the through part may be formed to pass through each insulating layer of the first substrate layer 200.

For example, the through part may include a first through electrode 231 passing through the first-first insulating layer 211. For example, the through part may include a first through electrode 231 passing through the first-first insulating layer 211 and electrically connecting the first pattern layer 221 and the second pattern layer 222.

Also, the through part may include a second through electrode 232 passing through the first-second insulating layer 212. For example, the through part may include a second through electrode 232 passing through the first-second insulating layer 212 and connecting the second pattern layer 222 and the third pattern layer 223.

The through part may include a third through electrode 233 passing through the first-third insulating layer 213. For example, the through part may include a third through electrode 233 passing through the first-third insulating layer 213 and electrically connecting the third pattern layer 223 and the fourth pattern layer 224.

The second substrate layer 300 may include a plurality of second insulating layers. For example, the second substrate layer 300 may include a second-first insulating layer 311, a second-second insulating layer 312, a second-third insulating layer 313, and a second-fourth insulating layer 314.

For example, the second substrate layer 300 may include four layers of insulating layer. However, the embodiment is not limited thereto, and the second insulating layer of the second substrate layer 300 may include three or less insulating layers and may include five or more insulating layers.

The second-first insulating layer 311 may be disposed on the first substrate layer 200. For example, the second-first insulating layer 311 may be disposed on an upper surface of the first-first insulating layer 211 disposed at an uppermost side of the first substrate layer 200.

The second-second insulating layer 312 may be disposed on the second-first insulating layer 311. Also, the second-third insulating layer 313 may be disposed on the second-second insulating layer 312. Also, the second-fourth insulating layer 314 may be disposed on the second-third insulating layer 313.

The second insulating layer of the fourth layer of the second substrate layer 300 may include the same insulating material as the first insulating layer of the first substrate layer 200, but is not limited thereto.

The second substrate layer 300 may include a second circuit layer.

For example, the second circuit layer may include a fifth pattern layer 321 disposed on the upper surface of the second-first insulating layer 311. For example, the second circuit layer may include a sixth pattern layer 322 disposed on the upper surface of the second-second insulating layer 312. For example, the second circuit layer may include a seventh pattern layer 323 disposed on the upper surface of the second-third insulating layer 313. For example, the second circuit layer may include an eighth pattern layer 324 disposed on the upper surface of the second-fourth insulating layer 314.

In this case, the second circuit layer of the second substrate layer 300 may be a conductive antenna pattern layer functioning as an antenna. For example, the fifth pattern layer 321, the sixth pattern layer 322, the seventh pattern layer 323, and the eighth pattern layer 324 may be connected to the first circuit layer of the first substrate layer 200. The fifth pattern layer 321, the sixth pattern layer 322, the seventh pattern layer 323, and the eighth pattern layer 324 may be an antenna unit functioning to transmit a transmission signal to an outside or to receive a signal transmitted from an outside.

The second substrate layer 300 may include a second through part. For example, the second substrate layer 300 may include a plurality of through electrodes passing through the second insulating layer, respectively.

For example, the second through part may include a fourth through electrode 331 passing through the second-first insulating layer 311. The fourth through electrode 331 may electrically connect the first pattern layer 221 of the first substrate layer 200 and the fifth pattern layer 321. For example, the second through part may include a fifth through electrode 332 passing through the second-second insulating layer 312. The fifth through electrode 332 may electrically connect the fifth pattern layer 321 and the sixth pattern layer 322. For example, the second through part may include a sixth through electrode 333 passing through the second-third insulating layer 313. The sixth through electrode 333 may electrically connect the sixth pattern layer 322 and the seventh pattern layer 323. For example, the second through electrode 333 may include a seventh through electrode 334 passing through the second-fourth insulating layer 314. The seventh through electrode 334 may electrically connect the seventh pattern layer 323 and the eighth pattern layer 334.

Meanwhile, the second substrate layer 300 may include a cavity C.

Accordingly, the second substrate layer 300 may include a third region RT1 vertically overlapping the cavity C and a fourth region RT2 other than the third region RT1.

The third region RT1 may be a region vertically overlapping the first region RB1 of the first substrate layer 200. The fourth region RT2 may be a region vertically overlapping the second region RB2 of the first substrate layer 200.

A cavity C of a space in which a semiconductor device is mounted may be formed in the third region RT1 of the second substrate layer 300. A second circuit layer of an antenna pattern functioning as an antenna may be formed in the fourth region RT2 of the second substrate layer 300.

In this case, when the circuit board 100 of the present application is an antenna board applied to an antenna device, circuit layers disposed on each layer of the circuit board may perform different functions.

For example, each of the first pattern layer 221, the second pattern layer 222, the third pattern layer 223, and the fourth pattern layer 224 of the first circuit layer of the first substrate layer 200 may include a first circuit part vertically overlapping a first region RB1. The first circuit part may vertically overlap the cavity C. The first circuit part may function as a mounting pad on which a chip such as a driving device or a passive device is mounted. Alternatively, the first circuit part may function as a terminal pad connecting an external substrate (e.g., a main board of a terminal) and a circuit board according to an embodiment.

Also, each of the first pattern layer 221, the second pattern layer 222, the third pattern layer 223, and the fourth pattern layer 224 of the first circuit layer may include a second circuit part vertically overlapping the second region RB2. The second circuit part may vertically overlap the second circuit layers formed in the fourth region RT2 of the second substrate layer 300.

In this case, the second circuit parts of the first circuit layer according to an embodiment may function as a terminal pad together with the first circuit part. In a case in which the second circuit part functions as a terminal pad together with the first circuit part, the circuit board according to an embodiment may function as an antenna only in the fourth region RT2 of the second substrate layer 300. For example, in a case in which the second circuit part of the first circuit layer does not function as an antenna pattern, the circuit board according to an embodiment may transmit a transmission signal to an upper side of the fourth region RT2 of the second substrate layer 300 or receive a signal received from an upper side of the fourth region RT2.

In addition, according to another embodiment, the second circuit part may be connected to the second circuit layers disposed in the fourth region RT2 of the second substrate layer 300. Accordingly, the second circuit part may function as an antenna pattern that transmits or receives a signal.

For example, the second circuit layer disposed in the fourth region RT2 of the second substrate layer 300 may be referred to as a first antenna pattern layer. Also, the second circuit part of the first circuit layer of the first substrate layer 200 may be a second antenna pattern layer connected to the first antenna pattern layer.

Accordingly, the embodiment may transmit signals in both directions of the circuit board or receive signals in both directions of the circuit board. For example, the embodiment may transmit signals to an upper side of the first antenna pattern layer and a lower side of the second antenna pattern layer. For example, the embodiment may receive signals from an upper side of the first antenna pattern layer and a lower side of the second antenna pattern layer.

Meanwhile, it is said that the first circuit part functions as a mounting pad or a terminal pad, but is not limited thereto. For example, a part of the first circuit part disposed in the first region RB1 of the first substrate layer 200 may function as a mounting pad or a terminal pad, and the remaining part may function as an antenna pattern together with the second antenna pattern layer.

Hereinafter, thickness and positional relationship of each pattern part of the first pattern layer 221 and the cavity C of the embodiment will be described in detail.

Referring to FIG. 3, the cavity C of an embodiment may pass through the second substrate layer 300. For example, the cavity C may pass through the second insulating layer. When the second insulating layer includes a plurality of layers, the cavity C may commonly pass through the second insulating layer of the plurality of layers.

The cavity C may include a plurality of parts. For example, the cavity C may be divided into a plurality of parts in a thickness direction with respect to a slope of an inner wall IW of the cavity C.

For example, the cavity C may include a first part P1 adjacent to an upper surface of the second substrate layer 300. In addition, the cavity C may include a second part P2 adjacent to a lower surface of the second substrate layer 300 and positioned below the first part P1.

In this case, the first part P1 may include a region whose width decreases toward the lower surface of the second substrate layer 300. For example, the inner wall IW1 of the first part P1 may have a first slope whose width decreases toward the first substrate layer 200. The first slope of the inner wall IW of the first part P1 may mean an inner angle between a reference line BL and a virtual straight line connected to the inner wall IW. The reference line BL may be parallel to an upper surface of the first substrate layer 200 vertically overlapping the cavity C.

Meanwhile, the first slope θ1 of the inner wall IW1 of the first part P1 may have a range between 115 and 150 degrees. For example, the first slope θ1 of the inner wall IW1 of the first part P1 may have a range between 118 and 148 degrees. For example, the first slope θ1 of the inner wall IW1 of the first part P1 may have a range between 120 and 145 degrees.

When the first slope θ1 of the inner wall (IW1) of the first part (P1) is less than 115 degrees, a process time required for forming the cavity (C) according to the embodiment may increase.

In addition, when the first slope (01) of the inner wall (IW1) of the first part (P1) is greater than 150, an upper width of the cavity (C) may increase, and accordingly, the circuit integration may decrease. For example, when the upper width of the cavity (C) increases, a space wasted meaninglessly may increase, and accordingly, an arrangement space of the circuit layer may decrease as the upper width of the cavity (C) increases.

Meanwhile, the cavity C of an embodiment may include a second part P2 positioned under the first part P1. The second part P2 may include a region whose width decreases toward the lower surface of the second substrate layer 300. For example, the second part P2 may include an inner wall IW2 whose width decreases toward the first substrate layer 200 and has a second slope (02) different from the first slope (01) of the inner wall (IW1) of the first part (P1). For example, the second slope θ2 of the second part P2 may be smaller than the first slope θ1 of the first part P1.

In this case, the second slope θ2 may mean a slope of the inner wall IW2 of the second part P2. For example, the second slope θ2 may mean an inner angle between a reference line BL and a virtual straight line extending from the inner wall IW2 of the second part P2.

The second slope θ2 of the inner wall IW2 of the second part P2 may be smaller than the first slope θ1 and may have a range between 91 and 120 degrees. For example, the second slope θ2 of the inner wall IW2 of the second part P2 may be smaller than the first slope θ1 and may have a range between 95 and 118 degrees. For example, the second slope θ2 of the inner wall IW2 of the second part P2 may be smaller than the first slope θ1 and may have a range between 98 and 115 degrees.

If the second slope θ2 of the inner wall IW2 of the second part P2 is less than 91 degrees, a semiconductor device may not be stably disposed in the cavity C. In addition, if the second slope θ2 of the inner wall IW2 of the second part P2 is greater than 120 degrees, a size of the cavity may be greater than a target size.

Meanwhile, vertical lengths of the first part P1 and the second part P2 of the cavity C may be different from each other. For example, the first part P1 of the cavity C may have a first length L1, and the second part P2 may have a second length L2 longer than the first length L1. In this case, the first length L1 may mean a depth of the first part P1 in a vertical direction. For example, the first length L1 may mean a vertical distance or a vertical length of the first part P1. Also, the second length L2 may mean a depth of the second part P2. For example, the second length L2 may mean a vertical distance or a vertical length of the second part P2 in the vertical direction.

In this case, the second length L2 may be 1.5 times or more, 3 times or more, 5 times or more, or 10 times or more of the first length L1. For example, the second length L2 may satisfy a range between 1.5 and 30 times the first length L1. For example, the second length L2 may satisfy a range between 3 and 28 times the first length L1. For example, the second length L2 may satisfy a range between 5 and 25 times the first length L1. For example, the second length L2 may satisfy a range between 10 to 20 times the first length L1.

In this case, when the second length L2 is less than 1.5 times the first length L1, an effect generated due to a difference between the first slope of the first part P1 and the second slope of the second part P2 may be insufficient. Also, when the second length L2 is more than 30 times the first length L1, the thickness of the second substrate layer 300 for satisfying the same may increase, and accordingly, the thickness of the circuit board may increase.

Meanwhile, the cavity C according to an embodiment may include a third part P3 below the second part P2. The third part P3 may be positioned lower than the second substrate layer 300. The second part P3 may have a third length L3 shorter than the first length L1 and the second length L2. The third part P3 of the cavity C may be provided in the first substrate layer 200, not the second substrate layer 300. For example, the third part P3 of the cavity C may overlap at least a portion of the first pattern layer 221 of the first substrate layer 200 in a horizontal direction. That is, the third part P3 may be provided by removing at least one pattern part of the first pattern layer 221 by etching. Furthermore, the third part P3 may be provided by removing a part of the first region RB1 of the first-first insulating layer 211 of the first substrate layer 200 along with a part of the first pattern layer 221. Specifically, the third part P3 may be provided by removing a part of a laser stopper layer (e.g., a part of the third pattern part 221-3) formed in a region vertically overlapping the cavity C of the first pattern layer 200.

For example, a total depth of the cavity C may be greater than a total thickness of the second insulating layer of the second substrate layer 300. For example, a depth of the cavity C in the first embodiment may be greater than a total thickness of the second insulating layer by the thickness of the third pattern part 221-3.

Accordingly, a lower surface of the cavity C may be positioned lower than a lower surface of the second substrate layer 300.

The third part P3 may have a third slope. The third slope may mean a slope of the inner wall IW3 of the third part P3. In this case, the inner wall IW1 of the first part P1 and the inner wall IW2 of the second part P2 mean an inner wall of the second insulating layer of the second substrate layer 300. Unlike this, the inner wall IW3 of the third part P3 of the first embodiment may mean a side surface of the third pattern part 221-3 of the first pattern layer 221.

Specifically, the first pattern layer 221 of the first substrate layer 200 may include a third pattern part 221-3 disposed to surround a boundary region between the first region RB1 and the second region RB2. The third pattern part 221-3 may be a part of a stopper layer used as a laser stopper in a laser process of forming the cavity C. A lower width of the cavity C may be less than the width of the stopper layer. If the cavity C having the same lower width as the width of the stopper layer is formed, a part of the upper surface of the first-first insulating layer 211 adjacent to the edge of the stopper layer may be laser-processed due to a process deviation in the laser process, and thus a reliability problem may occur. Accordingly, the cavity C may have a lower width smaller than the width of the stopper layer. Accordingly, a part of the stopper layer may be exposed through the cavity C, and the remaining part may not be exposed through the cavity C. In this case, the stopper layer through which the upper surface is exposed through the cavity C may be removed by etching to form the third part P3 of the cavity C. The stopper layer through which the upper surface is not exposed through the cavity C is not removed during the etching process, and accordingly, the third pattern part 221-3 of the first pattern layer 221 may constitute. The third slope of the inner wall IW3 of the third part P3 of the cavity C may mean an inclination angle of the side surface of the third pattern part 221-3. The third slope of the inner wall IW3 of the third part P3 may be determined by etching conditions of the stopper layer.

For example, in the first embodiment, the third slope of the inner wall IW3 of the third part P3 may be perpendicular to the reference line BL.

Meanwhile, the upper surface of the first substrate layer 200 according to an embodiment may have a step difference. For example, the upper surface of the first-first insulating layer 211 may have a step difference. Specifically, the upper surface of the first-first insulating layer 211 may include a first upper surface 211T1 and a second upper surface 211T2 having a step difference from the first upper surface 211T1. The first upper surface 211T1 of the first-first insulating layer 211 may form a lower surface or a bottom surface of the cavity C.

For example, the upper surface of the first-first insulating layer 211 may include a first upper surface 211T1 vertically overlapping the cavity C, and a second upper surface 211T2 not vertically overlapping the cavity C. That is, the first upper surface 211T1 of the first-first insulating layer 211 may correspond to a first region RB1 of the first substrate layer 200, and the second upper surface 211T2 of the first-first insulating layer 211 may correspond to a second region RB2 of the first substrate layer 200. Also, the first upper surface 211T1 of the first-first insulating layer 211 may be a lower surface of the cavity C, and may be a portion not in contact with the second substrate layer 300. Also, the second upper surface 211T2 of the first-first insulating layer 211 may have a step difference from the lower surface of the cavity C, and may mean a portion in contact with the second substrate layer 300. The second upper surface 211T2 of the first-first insulating layer 211 may not vertically overlap the first upper surface 211T1.

In this case, the first upper surface 211T1 may include a first overlapping region vertically overlapping the first pattern part 221-1 and a first non-overlapping region vertically overlapping the first pattern part 221-1.

In addition, the second upper surface 211T2 may include a second overlapping region vertically overlapping the second pattern part 221-2, a third overlapping region vertically overlapping the third pattern part 221-3, and a second non-overlapping region that does not vertically overlap the second pattern part 221-2 and the third pattern part 221-3.

In this case, in the circuit board of the comparative example, the first non-overlapping region of the first upper surface 211T1 of the first-first insulating layer 211 is positioned on the same plane as the second non-overlapping region of the second upper surface 211T2. Alternatively, the first non-overlapping region of the first upper surface 211T1 of the first-first insulating layer 211 of the embodiment may be positioned on a different plane from the second non-overlapping region of the second upper surface 211T2. For example, the first non-overlapping region of the first upper surface 211T1 of the first-first insulating layer 211 may be positioned lower than the second non-overlapping region of the second upper surface 211T2. For example, the first non-overlapping region of the first embodiment may be positioned lower by the thickness of the third pattern part 221-3 than the second non-overlapping region. Hereinafter, the first upper surface 211T1 of the first-first insulating layer 211 may mean the first non-overlapping region, and the second upper surface 211T2 of the first-first insulating layer 211 may mean the second non-overlapping region.

The first upper surface 211T1 of the first-first insulating layer 211 may be positioned higher than the lower surface of the second pattern part 221-2 of the first pattern layer 221. The first upper surface 211T1 of the first-first insulating layer 211 may be positioned on the same plane as the lower surface of the third pattern part 221-3. In this case, being positioned on the same plane may mean that a height difference therebetween is 1 μm or less, 0.5 μm or less, or 0.1 μm or less. Alternatively, being positioned on the same plane may mean that a height difference therebetween is 5% or less, 3% or less, or 1% or less of a thickness of the third pattern part 221-3.

The second upper surface 211T2 of the first-first insulating layer 211 may be positioned higher than the upper surface of the first pattern part 221-1 of the first pattern layer 221. The second upper surface 211T2 of the first-first insulating layer 211 may be positioned on the same plane as the upper surface of the third pattern part 221-3. In this case, being positioned on the same plane may mean that a height difference therebetween is 1 μm or less, 0.5 μm or less, or 0.1 μm or less. Alternatively, being positioned on the same plane may mean that a height difference therebetween is 5% or less, 3% or less, or 1% or less of a thickness of the third pattern part 221-3.

The first upper surface 211T1 and the second upper surface 211T2 of the first-first insulating layer 211 may have surface roughness different from each other. For example, the first upper surface 211T1 of the first-first insulating layer 211 may have surface roughness corresponding to that of the lower surface of the first pattern layer 221 formed through the plating process. Alternatively, the second upper surface 211T2 of the first-first insulating layer 211 may have surface roughness corresponding to that of the lower surface of the second-first insulating layer 311.

The first pattern part 221-1 of the first pattern layer 221 of the first embodiment may be disposed in a first region RB1 vertically overlapping the cavity C. Also, the second pattern part 221-2 of the first pattern layer 221 may be disposed in a second region RB2 that does not vertically overlap the cavity C. Also, the third pattern part 221-3 of the first pattern layer 221 may be disposed in a boundary region between the first region RB1 and the second region RB2.

Any one of the first pattern part 221-1, the second pattern part 221-2, and the third pattern part 221-3 may have a thickness different from that of another one of the first pattern part 221-1, the second pattern part 221-2, and the third pattern part 221-3. An upper surface of any one of the first pattern part 221-1, the second pattern part 221-2, and the third pattern part 221-3 may be positioned on a plane different from an upper surface of another one of the first pattern part 221-1, the second pattern part 221-2, and the third pattern part 221-3. For example, a lower surface of any one of the first pattern part 221-1, the second pattern part 221-2, and the third pattern part 221-3 may be positioned on a plane different from a lower surface of another one of the first pattern part 221-1, the second pattern part 221-2, and the third pattern part 221-3.

FIG. 3A is an enlarged view of an arrangement region of a first pattern layer of a circuit board according to a first embodiment, FIG. 3B is an enlarged view of an arrangement region of a first pattern layer of a circuit board according to a second embodiment, and FIG. 3C is an enlarged view of an arrangement region of a first pattern layer of a circuit board according to a third embodiment.

Referring to FIG. 3A, the first pattern layer 221 may include a first pattern part 221-1, a second pattern part 221-2, and a third pattern part 221-3.

The first pattern part 221-1 may be disposed in the first region RB1 of the first-first insulating layer 211. That is, the first pattern part 221-1 may vertically overlap the cavity C.

An upper surface of the first pattern part 221-1 may be positioned lower than upper surfaces of the second pattern part 221-2 and the third pattern part 221-3 of the first pattern layer 221. For example, the upper surface of the first pattern part 221-1 may be positioned lower than the second upper surface 211T2 of the first-first insulating layer 211. For example, the upper surface of the first pattern part 221-1 may be positioned lower than a lowermost side of the second substrate layer 300. The first pattern part 221-1 may have a first thickness T1. A specific feature of the first thickness T1 will be described below.

The second pattern part 221-2 may be disposed in the second region RB2 of the first-first insulating layer 211. The second pattern part 221-2 may not vertically overlap the cavity C. An upper surface of the second pattern part 221-2 may be positioned higher than the upper surface of the first pattern part 221-1. An upper surface of the second pattern part 221-2 may be positioned higher than the first upper surface 211T1 of the first-first insulating layer 211. An upper surface of the second pattern part 221-2 may be positioned on the same plane as the upper surface of the third pattern part 221-3. An upper surface of the second pattern part 221-2 may be positioned on the same plane as the second upper surface 211T2 of the first-first insulating layer 211. A lower surface of the second pattern part 221-2 may be positioned lower than the first upper surface 211T1 of the first-first insulating layer 211. A lower surface of the second pattern part 221-2 may be positioned lower than an upper surface of the first pattern part 221-1. A lower surface of the second pattern part 221-2 may be positioned on the same plane as the lower surface of the first pattern part 221-1. A lower surface of the second pattern part 221-2 may be positioned lower than a lower surface of the third pattern part 221-3. The second pattern part 221-2 may have a plurality of layer structures. For example, the second pattern part 221-2 may have a two-layer structure formed by a two-stage plating process. When the second pattern part 221-2 is formed by an SAP or MSAP process, the two-layer structure of the second pattern part 221-2 may mean that an electroplating layer excluding a copper foil layer and a chemical copper plating layer used as a seed layer may be provided as two layers. In this case, the second pattern part 221-2 may have a second thickness T2 greater than the first thickness T1. In this case, being positioned on the same plane may mean that a height difference therebetween is 1 μm or less, 0.5 μm or less, or 0.1 μm or less. Alternatively, being positioned on the same plane may mean that a height difference therebetween is 5% or less, 3% or less, or 1% or less of a thickness of the first pattern part 221-1, the second pattern part 221-3, or the third pattern part 221-3.

The third pattern part 221-3 may be formed in a boundary region between the first region RB1 and the second region RB2. Accordingly, a part of the third pattern part 221-3 may vertically overlap the cavity C, and otherwise, may not vertically overlap the cavity C. Preferably, at least a part of the third pattern part 221-3 may vertically overlap at least a part of the inner wall IW of the cavity C.

The upper surface of the third pattern part 221-3 may be positioned higher than the upper surface of the first pattern part 221-1. The upper surface of the third pattern part 221-3 may be positioned higher than the first upper surface 211T1 of the first-first insulating layer 211. The upper surface of the third pattern part 221-3 may be positioned on the same plane as the upper surface of the second pattern part 221-2. The upper surface of the third pattern part 221-3 may be positioned on the same plane as the second upper surface 211T2 of the first-first insulating layer 211. A lower surface of the third pattern part 221-3 may be positioned on the same plane as the upper surface of the first-first insulating layer 211 or the upper surface of the first pattern part 221-1. The lower surface of the third pattern part 221-3 may be positioned higher than the lower surface of the first pattern part 221-1 and the lower surface of the second pattern part 221-2. The third pattern part 221-3 may have a third thickness T3 less than the second thickness T2 of the second pattern part 221-2. In this case, being positioned on the same plane may mean that the height difference therebetween is 1 μm or less, 0.5 μm or less, or 0.1 μm or less. Alternatively, being positioned on the same plane may mean that the height difference therebetween is 5% or less, 3% or less, or 1% or less of the thickness of the first pattern part 221-1, the second pattern part 221-3, or the third pattern part 221-3.

The first thickness T1 of the first pattern part 221-1 may be determined based on the second thickness T2 of the second pattern part 221-2.

That is, the second thickness T2 of the second pattern part 221-2 may correspond to thicknesses of other pattern layers except for the first pattern part 221-1 and the third pattern part 221-3. At this time, being able to correspond to the thickness may mean that the difference between the second thickness T2 of the second pattern part 221-2 and the thickness of other pattern layers is 10% or less, 5% or less, 3% or less, or 1% or less of the thickness of the other pattern layers.

For example, the second thickness T2 of the second pattern part 221-2 may satisfy a range of 5 μm to 50 μm. For example, the second thickness T2 of the second pattern part 221-2 may satisfy a range of 10 μm to 40 μm. For example, the second thickness T2 of the second pattern part 221-2 may have a thickness in a range of 15 μm to 30 μm.

In addition, a sum (T1+T3) of a first thickness T1 of the first pattern part 221-1 and the third thickness T3 of the third pattern part 221-3 of the first embodiment may correspond to the second thickness T2 of the second pattern part 221-2.

That is, in an embodiment, the first pattern layer 221 may include a first metal layer and a second metal layer through the two-stage plating process. The first metal layer formed in the two-stage plating process may be used as the first pattern part 221-1 and the third pattern part 221-3, and the second metal layer may be used as the second pattern part 221-2 and the third pattern part 221-3.

Accordingly, the first pattern part 221-1 of an embodiment may include only the first metal layer, and the third pattern part 221-3 may include only the second metal layer. The second pattern part 221-2 may include both the first metal layer 221-21 and the second metal layer 221-22. Accordingly, the first metal layer 221-21 of the second pattern part 221-2 may have a first thickness T1 corresponding to the first pattern part 221-1. In this case, being able to correspond to the thickness may mean that a difference between the thickness of the first metal layer 221-21 of the second pattern part 221-2 and the first thickness T1 is 10% or less, 5% or less, 3% or less, or 1% or less of the first thickness T1. The second metal layer 221-22 of the second pattern part 221-2 may have a third thickness T3 corresponding to the third pattern part 221-3. In this case, being able to correspond to the thickness may mean that a difference between the thickness of the second metal layer 221-22 and the third thickness T3 is 10% or less, 5% or less, 3% or less, or 1% or less of the third thickness T3.

As described above, the first pattern layer 221 may be provided as two layers, and may be utilized as a mounting pad and a laser stopper layer, respectively. Accordingly, an embodiment may have a structure in which the first pattern part 221-1 corresponding to the mounting pad and the third pattern part 221-3 corresponding to the stopper layer are disposed on different planes. Accordingly, an embodiment may prevent the first pattern part 221-1 that is a mounting pad from being damaged during a process of forming the cavity C.

The first thickness T1 of the first pattern part 221-1 may satisfy a thickness range of 51% to 85% of the second thickness T2 of the second pattern part 221-2. The first thickness T1 of the first pattern part 221-1 may satisfy a range of 53% to 83% of the second thickness T2 of the second pattern part 221-2. For example, the first thickness T1 of the first pattern part 221-1 may satisfy a range of 55% to 80% of the second thickness T2 of the second pattern part 221-2.

If the first thickness T1 of the first pattern part 221-1 is less than 51% of the second thickness T2 of the second pattern part 221-2, the third thickness T3 of the third pattern part 221-3 may increase correspondingly. And, if the third thickness T3 of the third pattern part 22first-third increases, after the formation of the cavity C is completed, a time required to remove the third pattern part 221-3 by etching may increase, and thus processability may be deteriorated. In addition, if the third thickness T3 of the third pattern part 22first-third increases, a part of the third pattern part 22first-third in a region vertically overlapping the cavity C may not be removed in the etching process, thereby causing a reliability problem such as a short circuit as the first pattern part 221-1 is electrically connected to the third pattern part 221-3. In addition, if the first thickness T1 of the first pattern part 221-1 is less than 51% of the second thickness T2 of the second pattern part 221-2, an allowable current of the first pattern part 221-1 may decrease, and accordingly, the communication performance may be deteriorated. Meanwhile, if the first thickness T1 of the first pattern part 221-1 exceeds 85% of the second thickness T2 of the second pattern part 221-2, the third thickness T3 of the third pattern part 221-3 may decrease correspondingly. Accordingly, a problem of the laser penetrating the third pattern part 221-3 may occur in the laser process of forming the cavity C, and accordingly, the upper surface of the first-first insulating layer 211 may be damaged in the process of forming the cavity C. Preferably, the first thickness T1 of the first pattern part 221-1 may satisfy a range of 2.7 to 42.5 μm. For example, the first thickness T1 of the first pattern part 221-1 may satisfy a range of 5.1 to 33.2 μm. For example, the first thickness T1 of the first pattern part 221-1 may satisfy a range of 7.65 to 25.5 μm.

The third thickness T3 of the third pattern part 221-3 may satisfy a range of 15% to 49% of the second thickness T2 of the second pattern part 221-2. The third thickness T3 of the third pattern part 221-3 may satisfy a range of 17% to 47% of the second thickness T2 of the second pattern part 221-2. For example, the third thickness T3 of the third pattern part 221-3 may satisfy a range of 20% to 45% of the second thickness T2 of the second pattern part 221-2.

If the third thickness T3 of the third pattern part 221-3 is less than 15% of the second thickness T2 of the second pattern part 221-2, a problem in which the laser penetrates the third pattern part 221-3 may occur in the laser process of forming the cavity C, and accordingly, the upper surface of the first-first insulating layer 211 may be damaged in the process of forming the cavity C.

If the third thickness T3 of the third pattern part 221-3 is greater than 49% of the second thickness T2 of the second pattern part 221-2, a time required to remove the third pattern part 221-3 by etching in a region vertically overlapping the cavity C may increase, and accordingly, processability may be deteriorated. Also, if the third thickness T3 of the third pattern part 221-3 is greater than 49% of the second thickness T2 of the second pattern part 221-2, a part of the third pattern part 22first-third in the region vertically overlapping the cavity C may not be removed in the etching process, thereby causing a reliability problem such as a short circuit due to the electrical connection of the first pattern part 221-1 with the third pattern part 221-3. If the third thickness T3 of the third pattern part 221-3 is greater than 49% of the second thickness T2 of the second pattern part 221-2, it may be difficult to perform precise etching in the first and second metal layers of the first pattern layer 221 by a thickness corresponding to the second metal layer. Accordingly, the second metal layer may also be partially etched in the etching process, and thus a communication performance problem may occur due to a decrease in the thickness of the first pattern part 221-1.

Meanwhile, although the thickness T1 of the first pattern part 221-1 is greater than the thickness T3 of the third pattern part 221-3, the thickness of the first pattern part 221-1 may be equal to the thickness of the third pattern part 221-3. For example, the first metal layer 221-21 and the second metal layer 221-22 of the second pattern part 221-2 may have the same thickness. However, the communication performance of the circuit board is improved as the thickness of the first pattern part 221-1 is increased, and accordingly, in an embodiment, the thickness of the first pattern part 221-1 is increased with respect to the thickness of the third pattern part 221-3. Accordingly, the embodiment may reduce the time required in the etching process of the third pattern part 221-3, and maximize communication performance due to an increase in the thickness of the first pattern part 221-1.

As described above, the first pattern layer 221 may have a two-layer structure including a first metal layer and a second metal layer through two-stage plating. In this case, one of the first metal layer and the second metal layer may be used as a mounting pad, and the other may be used as a stopper. In addition, the second pattern part may include both the first and second metal layers. Accordingly, an embodiment may solve a reliability problem caused as the mounting pad and the stopper are disposed on the same plane. For example, in the comparative example, a process of forming a separate protective layer (not shown) on the mounting pad to prevent damage to the mounting pad in a laser process of forming a cavity is performed. On the other hand, the embodiment may utilize a part of the third pattern part 221-3 used as the laser stopper as a protection part of the first pattern part 221-1, which is the mounting pad Accordingly, an embodiment may prevent the first pattern part 221-1 that is the mounting pad from being damaged in the process of forming the cavity. Furthermore, an embodiment may omit a process of forming an additional protective layer for protecting the first pattern part 221-1.

Meanwhile, although the first pattern part 221-1, the second pattern part 221-2, and the third pattern part 221-3 are entirely embedded in the first insulating layer (more clearly, the first-first insulating layer 211), the embodiment is not limited thereto. More specifically, the entire region of each side surface of the first pattern part 221-1, the second pattern part 221-2, and the third pattern part 221-3 is illustrated as being covered by the first insulating layer 211 (more clearly, the first-first insulating layer 211), but the embodiment is not limited thereto.

For example, only some of the regions in a thickness direction of each of the first pattern part 221-1, the second pattern part 221-2, and the third pattern part 221-3 may be embedded in the first insulating layer. Among the regions in the thickness direction of the first pattern part 221-1, remaining regions except for a partial region may protrude on the first upper surface 211T1. And, remaining regions except for the partial region in the thickness direction of the second pattern part 221-2 and the third pattern part 221-3 may be embedded in the second insulating layer 311 (more clearly, the second-first insulating layer 311).

However, in the embodiment, in order to secure physical and electrical reliability and physical reliability of the first pattern part 221-1, the second pattern part 221-2, and the third pattern part 221-3, a thickness of each of the partial regions of the first pattern part 221-1, the second pattern part 221-2, and the third pattern part 221-3 may be greater than a thickness of the remaining regions. For example, more than 80% of the entire region in the thickness direction of each of the first pattern part 221-1, second pattern part 221-2, and third pattern part 221-3 may be embedded in the first insulating layer. For example, more than 90% of the entire region in the thickness direction of each of the first pattern part 221-1, second pattern part 221-2, and third pattern part 221-3 may be embedded in the first insulating layer. For example, more than 98% of the entire region in the thickness direction of each of the first pattern part 221-1, second pattern part 221-2, and third pattern part 221-3 may be embedded in the first insulating layer.

Meanwhile, pattern layers other than the first pattern layer 221 may have a second thickness T2 corresponding to a thickness of the second pattern part 221-2 of the first pattern layer 221.

Specifically, the second pattern layer 222, the third pattern layer 223, the fourth pattern layer 224, the fifth pattern layer 321, the sixth pattern layer 322, the seventh pattern layer 323, and the eighth pattern layer 324 may have a second thickness T2 equal to the thickness of the second pattern part 221-2 of the first pattern layer 221. In this case, having the same thickness may mean that the difference from the second thickness T2 is 10% or less, 5% or less, 3% or less, or 1% or less of the second thickness T2.

However, the second pattern layer 222, the third pattern layer 223, the fourth pattern layer 224, the fifth pattern layer 321, the sixth pattern layer 322, the seventh pattern layer 323, and the eighth pattern layer 324 may have a layer structure different from that of the second pattern part 221-2 of the first pattern layer 221. For example, the second pattern part 221-2 of the first pattern layer 221 may have the second thickness T2 by a two-stage plating process to distinguish the stopper from the mounting pad. The second pattern layer 222, the third pattern layer 223, the fourth pattern layer 224, the fifth pattern layer 322, the sixth pattern layer 322, the seventh pattern layer 323, and the eighth pattern layer 324 may not require layer distinction, and accordingly, may be formed through one plating process. For example, the second pattern layer 222, the third pattern layer 223, the fourth pattern layer 224, the fifth pattern layer 321, the sixth pattern layer 322, the seventh pattern layer 323, and the eighth pattern layer 324 may have a one-layer structure based on an electroplating layer. However, an embodiment is not limited thereto. For example, the second pattern layer 222, the third pattern layer 223, the fourth pattern layer 224, the fifth pattern layer 321, the sixth pattern layer 322, the seventh pattern layer 323, and the eighth pattern layer 324 may also be formed by performing two-stage plating, thereby having a two-layer structure based on the electroplating layer.

The first through electrode 231 of the first embodiment may have a fourth thickness T4. For example, the thickness of the first through electrode 231 may be the same as the thickness of the first-first insulating layer 211 in a region vertically overlapping the first circuit layer.

For example, the first through electrode 231 may have a fourth thickness T4 in a range of 10 μm to 60 μm. For example, the first through electrode 231 may have a thickness T4 in a range of 12 μm to 45 μm. For example, the first through electrode 231 may have a thickness of 15 μm to 30 μm.

Meanwhile, one side surface 221-3S1 of the third pattern part 221-3 may face the cavity C while horizontally overlapping the cavity C. One side surface 221-3S1 of the third pattern part 221-3 may be an inner wall IW3 of a third part P3 of the cavity C. In this case, as shown in FIG. 3A, one side surface 221-3S1 of the third pattern part 221-3 may have a third slope perpendicular to the reference line BL while being connected to the inner wall IW2 of the second part P2.

In this case, a slope and shape of one side of the third pattern part 221-3 may vary depending on the etching conditions in the etching process.

For example, as illustrated in FIG. 3B, one side surface 221-3S2 of the third pattern part 221-3 may have a predetermined slope inclined with respect to the reference line. For example, a width of the third pattern part 221-3 may decrease from a lower surface to an upper surface. That is, the third part P3 of the cavity C may have a slope whose width decreases as it approaches the first-first insulating layer 211.

Also, as shown in FIG. 3C, in an embodiment, the third pattern part 221-3 may include a concave portion 221-3U. This may be achieved by adjusting etching conditions in a process of removing a part of the third pattern part 221-3 vertically overlapping the cavity C by etching after the formation of the cavity C is completed. For example, the side surface of the third pattern part 221-3 may be spaced apart from the lower end of the inner wall IW2 of the second part P2 of the cavity C in a horizontal direction away from the cavity C. Accordingly, the third part P3 of the cavity C may be greater than the width of the lower region of the second part P2 by a region corresponding to the concave portion 221-3U.

A horizontal distance of the concave portion 221-3U may range from 1 μm to 12 μm. The horizontal distance of the concave portion 221-3U may range from 2 μm to 10 μm. The horizontal distance of the concave portion 221-3U may range from 3 μm to 8 μm.

Here, the horizontal distance may mean a horizontal distance from an inner wall of the cavity C adjacent to the concave portion 221-3U to one side surface of the third pattern part 221-3. In this case, the third pattern part 221-3 may include a region whose width changes (e.g., increases or decreases) from the lower surface to the upper surface according to an etching condition. In addition, the horizontal distance may mean any one of a greatest horizontal distance of the greatest concave region, a minimum horizontal distance of a smallest concave region, and an average distance of an entire region.

FIGS. 4A and 4B are top plan views of the second substrate layer.

Referring to FIG. 4A, the second substrate layer 300 may include a third region RT1 and a fourth region RT2. The third region RT1 may be a region having a cavity C formed to pass through the second substrate layer 300. In this case, the third region RT1 and the fourth region RT2 may be formed in the width direction or the length direction of the second substrate layer 300, respectively. For example, the third region RT1 may be disposed at one side of the fourth region RT2.

Referring to FIG. 4B, the third region RT1 may be disposed at a center of the second substrate layer 300. The fourth region RT2 may be formed to surround the third region RT1.

Hereinafter, a modified example of a first pattern part of the first pattern layer 221 and the first-first insulating layer 211 according to an embodiment will be described.

FIG. 5A is a view illustrating a circuit board according to a first modified example, FIG. 5B is a view illustrating a circuit board according to a second modified example, and FIG. 5C is a view illustrating a circuit board according to a third modified example.

Before describing the first to third modified examples, a manufacturing process of the first pattern part 221-1 and the third pattern part 221-3 of the first pattern layer 221 of the embodiment will be briefly described.

Before the cavity C is formed, the third pattern part 221-3 may be disposed on the first pattern part 221-1 as a whole in the first region RB1 and the boundary region vertically overlapping the cavity C.

Furthermore, the first region RB1 vertically overlapping the cavity C of an entire region of the third pattern part 221-3 may be etched after the cavity C that proceeds through a laser process is formed. In this case, under an ideal process condition, only the third pattern part 221-3 disposed on the first pattern part 221-1 may be selectively removed. Accordingly, the first pattern part 221-1 and the third pattern part 221-3 may have a positional relationship and a thickness relationship as illustrated in FIG. 3A.

In this case, the etching process of removing the third pattern part 221-3 may be performed to have a thickness greater than or equal to the thickness of the third pattern part 221-3 according to etching conditions.

As illustrated in FIG. 5A, the first pattern part 221-1 may have a first' thickness T1*a* less than the first thickness T1 of FIG. 3A. That is, the embodiment may allow a part of the first pattern part 221-1 to be etched together in the process of etching the third pattern part 221-3. Accordingly, the first pattern part 221-1 may have the first' thickness T1*a*.

Accordingly, the upper surface of the first pattern part 221-1 may be positioned lower than the first upper surface 211T1 of the first-first insulating layer 211. Also, the upper surface of the first pattern part 221-1 may be positioned lower than the lower surface of the third pattern part 221-3. Also, the upper surface of the first pattern part 221-1 may be positioned lower than the upper surface of the first metal layer 221-21 of the second pattern part 221-2. For example, the thickness T1 of the first pattern part 22first-first in FIG. 3A corresponds to the thickness of the first metal layer 221-21 of the second pattern part 221-2. Alternatively, in the first modified example, the first' thickness T1*a* of the first pattern part 221-1 may be smaller than the thickness T1 of the first metal layer 221-21 of the second pattern part 221-2.

Meanwhile, the third pattern part 221-3 before the etching process may be formed in the entire first region RB1 vertically overlapping the cavity C. In this case, when the etching of the region vertically overlapping the first region RB1 among the entire regions of the third pattern part 221-3 is not performed as a whole, a part of the third pattern part 221-3 may remain on the first region RB1. If there is a part of the remaining third pattern part 221-3, an electrical short problem may occur due to connection between a plurality of first pattern parts 221-1 by the remaining part. Accordingly, in an embodiment, the etching conditions are adjusted to allow the third pattern part 221-3 on the first region RB1 and the part of the first pattern part 221-1 to be etched together. Accordingly, an embodiment may solve an electrical reliability problem due to the remaining part of the third pattern part 221-3, thereby improving product reliability.

Also, a step difference may be provided between the upper surface of the first pattern part 22first-first in the first modified example and the first upper surface 211T1 of the first-first insulating layer 211. For example, a recessed portion (not shown) recessed downward with respect to the first upper surface 211T1 of the first-first insulating layer 211 may be provided on the upper surface of the first pattern part 22first-first in the first modified example. The recessed portion of the first pattern part 221-1 may function as a dam to support a connection part such as a solder ball connected to a chip while being stably disposed.

Meanwhile, a vertical distance (e.g., T1-T1*a*) between a lower surface of the third pattern part 221-3 or the first upper surface 211T1 of the first-first insulating layer 211 and the upper surface of the first pattern part 221-1 may satisfy a range of 2% to 10% of the first thickness T1. A vertical distance (e.g., T1-T1*a*) between the lower surface of the third pattern part 221-3 or the first upper surface of the first-first insulating layer 211 and the upper surface of the first pattern part 221-1 may satisfy a range of 3% to 9% of the first thickness T1. A vertical distance (e.g., T1-T1*a*) between the lower surface of the third pattern part 221-3 or the first upper surface 211T1 of the first-first insulating layer 211 and the upper surface of the first pattern part 221-1 may satisfy a range of 3.5% to 8% of the first thickness T1. If the vertical distance (e.g., T1-T1*a*) between the lower surface of the third pattern part 221-3 or the first upper surface 211T1 of the first-first insulating layer 211 and the upper surface of the first pattern part 221-1 is less than 2% of the first thickness T1, the effect of the dam function may be insufficient due to a small depth of the recessed potion of the first pattern part 221-1. In addition, if the vertical distance (e.g., T1−T1*a*) between the lower surface of the third pattern part 221-3 or the upper surface of the first-first insulating layer 211 and the upper surface of the first pattern part 221-1 exceeds 10% of the first thickness T1, the allowable current of the first pattern part 221-1 may decrease due to the decrease in the thickness T1*a* of the first pattern part 221-1, thereby deteriorating communication performance.

Meanwhile, as shown in FIG. 5B, the second modified example may have a difference in height of the first upper surface 211T1*a* of the first-first insulating layer 211 compared to the circuit board of FIG. 3A.

That is, after etching the third pattern part 221-3, an additional etching process may be performed on the first region RB1 of the first-first insulating layer 211*a*. Accordingly, the first upper surface 211T1 of the first-first insulating layer 211*a* may be positioned lower than the upper surface of the first pattern part 221-1.

That is, the first upper surface 211T1 of the first-first insulating layer 211*a* may be positioned lower than the lower surface of the third pattern part 221-3. For example, the first upper surface 211T1 of the first-first insulating layer 211*a* may be positioned lower than the upper surface of the first metal layer 221-21 of the second pattern part 221-2.

That is, the problem of debris remaining may be solved by etching a part of the first upper surface 211T1 of the first-first insulating layer 211*a* vertically overlapping the first region RB1, instead of etching a part of the first pattern part 221-1 to solve the problem of the third pattern part 221-3.

Meanwhile, a vertical distance T5 between the lower surface of the third pattern part 221-3 or the upper surface of the first pattern part 221-1 and the first upper surface 211T1 of the first-first insulating layer 211*a* may satisfy a range of 2% to 10% of the first thickness T1. For example, a vertical distance T5 between the lower surface of the third pattern part 221-3 or the upper surface of the first pattern part 221-1 and the first upper surface 211T1 of the first-first insulating layer 211*a* may satisfy a range of 3% to 9% of the first thickness T1. For example, a vertical distance T5 between the lower surface of the third pattern part 221-3 or the upper surface of the first pattern part 221-1 and the first upper surface 211T1 of the first-first insulating layer 211*a* may satisfy a range of 3.5% to 8% of the first thickness T1.

If the vertical distance T5 between the lower surface of the third pattern part 221-3 or the upper surface of the first pattern part 221-1 and the first upper surface 211T1 of the first-first insulating layer 211*a* is less than 2% of the first thickness T1, the problem of debris remaining may not be completely solved. Also, If the vertical distance T5 between the lower surface of the third pattern part 221-3 or the upper surface of the first pattern part 22first-first insulating layer 211*a* exceeds 10% of the first thickness T1, a region (e.g., an exposed region) not covered by the first-first insulating layer 211*a* increases among the side surfaces of the first pattern part 221-1, which may cause a physical reliability problem with the first pattern part 221-1.

Meanwhile, as illustrated in FIG. 3C, the third modified example may apply both the first modified example and the second modified example, and accordingly, the upper surface of the first pattern part 221-1 and the first upper surface 211T1 of the first-first insulating layer 211*a* may be positioned on the same plane.

Accordingly, the upper surface of the first pattern part 221-1 and the first upper surface 211T1 of the first-first insulating layer 211*a* may be positioned lower than the lower surface of the third pattern part 221-3, the upper surface of the first metal layer 221-21 of the second pattern part 221-2, and the lower surface of the second metal layer 221-22 of the second pattern part 221-2.

FIG. 6 is a view illustrating a circuit board according to a second embodiment, and FIG. 7 is an enlarged view of a partial region of FIG. 6.

The circuit board according to FIGS. 6 and 7 may correspond to the structure of the circuit board of FIG. 2, and thicknesses of through electrodes of the first substrate layer and the second substrate layer and thicknesses of the first insulating layer and the second insulating layer may be different from that of the circuit board of FIG. 2.

Referring to FIGS. 6 and 7, the circuit board 1100 may include a first substrate layer 1200 and a second substrate layer 1300.

The first substrate layer 1200 and the second substrate layer 1300 are the same as the first substrate layer 200 and the second substrate layer 300 of FIG. 1, and a detailed description thereof will be omitted.

Meanwhile, the thickness of the through electrode in the circuit board in FIG. 1 is greater than the thickness of the circuit layer.

Alternatively, the thickness of the through electrode in the circuit board of the second embodiment may be equal to or less than the thickness of the circuit layer.

This can be achieved by reducing the thickness of the insulating layer and thus the thickness of the through electrode while maintaining the thickness of the circuit layer of the circuit board in FIG. 1.

That is, a cavity C may be formed in the second substrate layer, and a semiconductor device may be disposed in the cavity C. Accordingly, the driving unit of the antenna device of the embodiment may be disposed in a horizontal direction rather than a vertical direction of the antenna unit. For example, the driving unit is disposed in a direction (e.g., a vertical direction thereof) different from a signal radiation direction of an antenna pattern layer of the antenna unit. Accordingly, the embodiment may not affect communication performance even if the thickness of the insulating layer and the thickness of the through electrode are increased or the distance between the antenna and the driving unit is not sufficiently maintained. Accordingly, an embodiment may reduce the thickness of each insulating layer of the first substrate layer and the second substrate layer, thereby reducing the thickness of the through electrode passing through the insulating layer.

Hereinafter, the first-first insulating layer 1211 and the first through electrode 1231 disposed in the first-first insulating layer 1211 in the first substrate layer 1200 and the second substrate layer 1300 of the second embodiment will be described. However, other insulating layers and through electrodes other than the first-first insulating layer 1211 and the first through electrode 1231 may also have thicknesses to be described below.

The first substrate layer 1200 may include a first-first insulating layer 1211, a first-second insulating layer 1212 a first pattern layer 1221, a second pattern layer 1222, and a first through electrode 1231. An upper surface of the first substrate layer 1200 according to an embodiment may have a step difference. For example, the upper surface of the first-first insulating layer 1211 may have a step difference. Specifically, the upper surface of the first-first insulating layer 1211 may include a first upper surface 1211T1 and a second upper surface 1211T2 having a step difference from the first upper surface 1211T1. The second substrate layer 1300 may include a second-first insulating layer 2311.

The first pattern layer 1221 may include a first pattern part 1221-1, a second pattern part 1221-2, and a third pattern part 1221-3.

The first pattern part 1221-1, the second pattern part 1221-2 and the third pattern part 1221-3 of the first pattern layer 1221 are substantially the same as the first pattern part 221-1, the second pattern part 221-2, and the third pattern part 221-3 described in the first embodiment, and accordingly, a detailed description thereof will be omitted. In addition, the second pattern layer 1222 is substantially the same as the second pattern layer 222 described in the first embodiment, and accordingly, a description thereof will be omitted.

Meanwhile, the first through electrode 1231 may be disposed in the first-first insulating layer 1211. The first through electrode 1231 may connect the first pattern layer 1221 and the second pattern layer 1222.

The first through electrode 1231 may have a fourth' thickness T4*a* smaller than the fourth thickness T4 of the first through electrode 231 of the first embodiment.

For example, the first through electrode 1231 may have the same thickness as at least one of the pattern parts of the first pattern layer 1221 of the first pattern layer 1221.

For example, the first through electrode 1231 may have the same thickness as the first pattern layer 1221 of the first pattern layer 1221. For example, the first through electrode 1231 may have the same thickness as the second pattern part 1221-2 of the first pattern layer 1221.

Preferably, the fourth' thickness T4*a* of the first through electrode 1231 may be less than or equal to the second thickness T2 of the second pattern part 1221-2 of the first pattern layer 1221. That is, the fourth' thickness T4*a* of the first through electrode 1231 may be equal to or less than the second thickness T2 of the second pattern part 1221-2.

The fourth' thickness T4*a* of the first through electrode 1231 may satisfy a range of 51% to 100% of the second thickness T2 of the second pattern part 1221-2. For example, the fourth' thickness T4*a* of the first through electrode 1231 may satisfy a range of 60% to 95% of the second thickness T2 of the second pattern part 1221-2. The fourth' thickness T4*a* of the first through electrode 1231 may satisfy a range of 65% to 90% of the second thickness T2 of the second pattern part 1221-2.

If the fourth' thickness T4*a* of the first through electrode 1231 is less than 51% of the second thickness T2 of the second pattern part 1221-2, a signal interference may occur between the first pattern layer 1221 and the second pattern layer 1222 as a distance between the first pattern layer 1221 and the second pattern layer 1222 becomes too close, and thus a signal transmission loss may increase. If the fourth' thickness T4*a* of the first through electrode 1231 exceeds 100% of the second thickness T2 of the second pattern part 1221-2, an effect of reducing a thickness of the circuit board according to an embodiment may be insufficient.

As described above, an embodiment may allow the fourth' thickness T4*a* of the first through electrode 1231 to have the same thickness as that of the first circuit layer or smaller than that of the first circuit layer, thereby reducing the thickness of the circuit board. Also, the thickness of the first through electrode is reduced, and accordingly, an embodiment may reduce a signal transmission distance in a signal transmission path including the first through electrode, thereby minimizing a signal transmission loss.

Meanwhile, an embodiment may include a semiconductor device mounted in the cavity C, and accordingly, a thickness of a through electrode disposed in a region adjacent to the cavity C may be reduced. Accordingly, an embodiment may minimize a transmission path of a signal transmitted from the semiconductor device or a signal provided to the semiconductor device, and thus, a signal transmission loss may be minimized.

Accordingly, only the first through-electrode 1231 disposed closest to the cavity C among the through-electrode disposed in each insulating layer may have the fourth' thickness T4*a*. Remaining through electrodes other than the first through electrode 1231 (e.g., through electrodes disposed in the second insulating layer, through electrodes disposed in the first-second insulating layer, and through electrodes disposed in the first-third insulating layer) may have a thickness (e.g., T4) greater than the fourth' thickness T4*a* of the first through electrode 1231. In particular, the through-electrode disposed in the second insulating layer horizontally overlapping the cavity C may transmit or receive a signal through an antenna pattern. In this case, the transmission intensity or reception intensity of a signal through the antenna pattern may increase in proportion to the signal transmission path. Accordingly, in an embodiment, the through electrode disposed in the second insulating layer, the through electrode disposed in the first-second insulating layer, and the through electrode disposed in the first-third insulating layer excluding the first through electrode 1231 may have a fourth thickness T4, and thus communication performance may be maximized.

In addition, the embodiment can increase the number of layers of the circuit layer by reducing the thickness of the insulating layer and through electrode in the circuit board having the same thickness as the comparative example, thereby improving circuit integration and communication performance.

FIG. 8 is a view illustrating a semiconductor package according to an embodiment.

Description of portions of the circuit boards of the third embodiment that are substantially the same as the circuit boards of the first and second embodiments will be omitted. Specifically, in FIG. 8, among the reference numerals formed by adding "2" to the front of the reference numerals used in FIGS. 1 and 2, those not specifically described denote the same or corresponding components as those of FIGS. 1 and 2, and thus repeated descriptions thereof will be omitted.

At least one of a plurality of insulating layers of the first insulating layer of the first substrate of the circuit board of the third embodiment may have a thickness different from that of at least one other insulating layer. For example, the first-first insulating layer 2211 disposed closest to the cavity C may have a thickness different from that of the first-second insulating layer 2212 and the first-third insulating layer 2213.

For example, a thickness T14 of the first-first insulating layer 2211 may be greater than a thickness T15 of each of the first-second insulating layer 2212 and the first-third insulating layer 2213.

For example, each thickness T15 of the first-second and first-third insulating layers 2212 and 2213 may satisfy a range of 10 μm to 60 μm. For example, each thickness T15 of the first-second and first-third insulating layers 2212 and 2213 may satisfy a range of 12 μm to 45 μm. For example, each thickness T15 of the first-second and first-third insulating layers 2212 and 2213 may satisfy a range of 15 μm to 30 μm.

However, although the first-second insulating layer 2212 and the first-third insulating layer 2213 are described to have the same thickness T15, the present invention is not limited thereto. For example, each of the first-second insulating layer 2212 and the first-third insulating layer 2213 may have a thickness smaller than a thickness T14 of the first-first insulating layer 2211 and may have different thicknesses from each other.

For example, the first-second insulating layer 2212 may satisfy a range of 10 μm to 60 μm while being smaller than the thickness T14 of the first-first insulating layer 2211. The first-third insulating layer 2213 may be smaller than the thickness T14 of the first-first insulating layer 2211 and may have a thickness smaller or greater than the thickness of the first-second insulating layer 2212 within a range of 10 μm to 60 μm.

Meanwhile, the thickness T14 of the first-first insulating layer 2211 may be greater than the thickness T15 of the first-second insulating layer 2212 and the first-third insulating layer 2213. For example, the thickness T14 of the first-first insulating layer 2211 may satisfy a range of 110% to 220% of the thickness T15 of the first-second insulating layer 2212 and the first-third insulating layer 2213. For example, the thickness T14 of the first-first insulating layer 2211 may satisfy a range of 120% to 210% of the thickness T15 of the first-second insulating layer 2212 and the first-third insulating layer 2213. For example, the thickness T14 of the first-first insulating layer 2211 may satisfy a range of 130% to 200% of the thickness T15 of the first-second insulating layer 2212 and the first-third insulating layer 2213.

If the thickness T14 of the first-first insulating layer 2211 is less than 110% of the thickness T15 of each of the first-second and first-third insulating layers 2212 and 2213, the adhesion between the first-first insulating layer 2211 and the second substrate layer 2300 is degraded, and thus a delaminating problem in which the first-first insulating layer 2211 is separated from the second substrate layer 2300 may occur. Also, if the thickness T14 of the first-first insulating layer 2211 exceeds 220% of the thickness T15 of each of the first-second and first-third insulating layers 2212 and 2213, the thickness of the circuit board may increase due to the thickness T14 of the first-first insulating layer 2211, and a signal transmission distance between the first substrate layer 2200 and the second substrate layer 2300 may increase.

For example, the thickness T14 of the first-first insulating layer 2211 may satisfy a range of 11 μm to 132 μm. For example, the thickness T14 of the first-first insulating layer 2211 may satisfy a range of 14.5 μm to 94.5 μm. For example, the thickness T14 of the first-first insulating layer 2211 may satisfy a range of 19.5 μm to 60 μm.

That is, the first-first insulating layer 2211 may be disposed closest to the cavity C without providing the cavity C. And the first-first insulating layer 2211 may have a greater thickness than each of other insulating layers.

Preferably, a change in the thickness of the insulating layer may occur based on the position of the first pattern layer 2221. That is, the first pattern layer 2221 may include a pattern used as a stopper in a process of forming the cavity C. Accordingly, the embodiment may increase a thickness of the insulating layer contacting the first pattern layer 2221 including the pattern used as the stopper. In this case, the insulating layer contacting the first pattern layer 2221 may include a first-first insulating layer 2211 disposed on the uppermost side of the first substrate layer 2200 and a second-first insulating layer 2311 disposed on the lowermost side of the second substrate layer 2300. In this case, the embodiment may increase the thickness of the first-first insulating layer 2211 while maintaining the thickness of the second-first insulating layer 2311. Accordingly, the embodiment may improve an adhesive force between the first-first insulating layer 2211 and the first pattern layer 2221 and an adhesive force between the first-first insulating layer 2211 and the second-first insulating layer 2311.

In this case, the reason for increasing the thickness of the first-first insulating layer 2211 among the first-first insulating layer 2211 and the second-first insulating layer 2311 in contact with the first pattern layer 2221 may be due to a process order of manufacturing the circuit board.

For example, any one of the first-first insulating layer 2211 and the second-first insulating layer 2311 may be stacked before the first pattern layer 2221 is formed, and the other may be stacked after the first pattern layer 2221 is formed. Preferably, the second-first insulating layer 2311 may be stacked before the first pattern layer 2221 is formed.

In addition, the first-first insulating layer 2211 may be stacked on the second-first insulating layer 2311 and the first pattern layer 2221 after the first pattern layer 2221 is formed.

Accordingly, in an embodiment, a thickness T14 of the first-first insulating layer 2211 stacked after the formation of the first pattern layer 2221 is greater than a thickness T15 of other insulating layers. Accordingly, a surface area (a surface area before etching is performed in a cavity region) of the first pattern layer 2221 including the stopper may exceed 60%, and thus, a decrease in adhesion between the first-first insulating layer 2211 and the first pattern layer 2221 and/or the second-first insulating layer 2311 may be solved, thereby improving physical reliability of the circuit board.

Meanwhile, each second insulating layer of the second substrate layer 2300 may have a thickness T16 equal to the thickness T15 of the first-second insulating layer 2212 and the first-third insulating layer 2213 of the first substrate layer 2200.

For example, each of the second-first insulating layer 2311, the second-second insulating layer 2312, the second-third insulating layer 2313, and the second-fourth insulating layer 2314 may have a thickness T16 that is the same as a thickness T15 of the first-second insulating layer 2212 and the first-third insulating layer 2213. For example, each of the second-first insulating layer 2311, the second-second insulating layer 2312, the second-third insulating layer 2313, and the second-fourth insulating layer 2314 may have a thickness T16 that is different from a thickness T14 of the first-first insulating layer 2211.

However, the embodiment is not limited thereto.

For example, each of the second-second insulating layer 2312, the second-third insulating layer 2313, and the second-fourth insulating layer 2314 may have a thickness T16 equal to the thickness T15 of each of the first-second and first-third insulating layers 2212. In addition, the second-first insulating layer 2311 may have a thickness T16 equal to the thickness T14 of the first-first insulating layer 2211.

In addition, at least one thickness T16 of the second-first insulating layer 2311, the second-second insulating layer 2312, the second-third insulating layer 2313, and the second-fourth insulating layer 2314 may be smaller than the thickness of the first-first insulating layer 2211 and may have a thickness different from that of the first-second or first-third insulating layer 2212 or 2213 (e.g., a large thickness or a small thickness).

In conclusion, the thickness T14 of the first-first insulating layer 2211 stacked after the first pattern layer 2221 is formed based on the position of the first pattern layer 2221 is greater than the thickness of other insulating layers other than the first-first insulating layer. Accordingly, the embodiment may fundamentally solve the problem of adhesion according to an area of the first pattern layer 2221 used as the stopper layer for forming the cavity.

Meanwhile, the third slope of the inner wall IW3 of the third part P3 of the cavity C may have a curved surface. For example, in an embodiment, in the process of etching the stopper layer, the etching may be performed under over-etching conditions. Accordingly, at least a portion of the stopper layer covered with the second substrate layer may be removed.

That is, the concave portion 2221-3U may vertically overlap the second-first insulating layer 2311. In the embodiment, at least a portion of the lower surface of the second-first insulating layer 2311 may be exposed through the concave portion 2221-3U. In addition, the concave portion 221-3U may be filled with a molding layer in a molding process of the chip. Accordingly, the molding layer may also contact at least a portion of the lower surface of the second-first insulating layer 2311 while filling the concave portion 2221-3U. Accordingly, the embodiment may further improve adhesion between the molding layer and the circuit board.

FIG. 9 is a diagram illustrating a circuit board according to a fourth embodiment. Specifically, in FIG. 9, among the reference numerals formed by adding "3" to the front of the reference numerals used in FIGS. 1 and 2, those not specifically described denote the same or corresponding components as those of FIGS. 1 and 2, and thus repeated descriptions thereof will be omitted.

The circuit board of FIG. 9 has a difference in the position of the first pattern layer 3221 compared to the circuit board of FIG. 8, and other structures other than the position of the first pattern layer 3221 may be substantially the same.

The first pattern layer of the third embodiment has a structure embedded in the first-first insulating layer 2211 of the first substrate layer 2200.

The first pattern layer 3221 of the fourth embodiment may have a structure embedded in the second-first insulating layer 3311 of the second substrate layer 3300.

In other words, the first pattern layer 3221 of the fourth embodiment may have a structure protruding on the upper surface of the first-first insulating layer 3211.

Accordingly, the first pattern layer 3221 of the fourth embodiment may have the same thickness for each region. For example, the first pattern layers of the first to third embodiments include first to third pattern parts having different thicknesses for each region. Alternatively, the first to third pattern parts of the fourth embodiment may have the same thickness and may be disposed on the same layer.

This may be caused by a difference between a manufacturing process of the circuit board of the fourth embodiment and a manufacturing process of the circuit board of the first to third embodiments.

Meanwhile, in the manufacturing process of the first to third embodiments, the first-first insulating layer may be stacked after the first pattern layer is formed.

Alternatively, in the manufacturing process of the fourth embodiment, after the first pattern layer 3221 is disposed on the first-first insulating layer 3211, a stacking process of the second-first insulating layer 3311 may be performed. Accordingly, the first-first insulating layer 3211 of the fourth embodiment has the same thickness T15 as that of other insulating layers except for the second-first insulating layer 3311.

The second-first insulating layer 3311 may have a thickness T14 greater than a thickness T15 of other insulating layers including the first-first insulating layer 3211.

In addition, the second insulating layers other than the second-first insulating layer 3311 may have a thickness T16 smaller than the thickness T14 of the second-first insulating layer 3311.

FIG. 10 is a diagram illustrating a semiconductor package according to an embodiment.

Referring to FIG. 10, the semiconductor package may include the circuit board 100 illustrated in FIG. 1. However, the embodiment is not limited thereto, and the semiconductor package of the embodiment may include a circuit board illustrated in other drawings other than FIG. 1.

The semiconductor package may include a first protective layer 340 disposed on an upper surface of the second substrate layer 300 of the circuit board 100. Also, the semiconductor package may include a second protective layer 240 disposed on a lower surface of the first substrate layer 200 of the circuit board 100.

Furthermore, the semiconductor package may include a first connection part 410 disposed on the first pattern part 221-1 disposed in a region vertically overlapping the cavity C among the first pattern layers 221 of the first substrate layer 200. A planar shape of the first connection part 410 may be circular. Alternatively, the planar shape of the first connection part 410 may be rectangular. The first connection part 410 may be disposed on the first pattern part 221-1 to connect the first pattern part 221-1 to a terminal 425 of a device 420. The first connection part 410 may be a solder ball. The first connection part 410 may contain a material of a different component in solder. The solder may be composed of at least one of Sn—Cu, Sn—Pb, and Sn—Ag—Cu. And, the material of the different component may contain any one of Al, Sb, Bi, Cu, Ni, In, Pb, Ag, Sn, Zn, Ga, Cd, and Fe.

A semiconductor device 420 may be disposed on the first connection part 410, and the semiconductor device 420 may be a driver device. For example, the semiconductor device 420 may be a driving device for driving an antenna pattern layer included in the circuit board. Also, although only one semiconductor device is illustrated as being mounted in the cavity C in the drawing, the present invention is not limited thereto. For example, a passive device (not shown) for operating the semiconductor device 420 in addition to the semiconductor device 420 may be additionally mounted in the cavity C.

Meanwhile, a molding layer 430 may be formed in the cavity C to cover the semiconductor device 420. The molding layer 430 may be an epoxy molding compound (EMC), but is not limited thereto. The molding layer 430 may be provided to fill the cavity part of the third pattern part.

Also, a second connection part 440 may be disposed on the lower surface of the pattern layer disposed on the lower surface of the first region RB1 of the first substrate layer 200. The second connection part 440 may connect the semiconductor package with an external substrate (e.g., a main board of a terminal).

Hereinafter, a method of manufacturing a circuit board according to an embodiment will be described in order of processes.

FIGS. 11A to 11P are views illustrating a method of manufacturing a circuit board according to a first embodiment shown in FIG. 1 in order of processes.

Hereinafter, a method of manufacturing the circuit board according to the first embodiment of FIG. 1 will be described with reference to FIGS. 11A to 11P. However, a circuit board according to another embodiment except for the first embodiment may be manufactured using a process described below.

The manufacturing process of the circuit board of the embodiment of the present application may include a first process of manufacturing a part of the first substrate layer and a part of the second substrate layer using a carrier board, a process of manufacturing the remaining part of the first substrate layer and the remaining part of the second substrate layer above and below the substrate layer manufactured through the first process, respectively, a process of forming a cavity in the second substrate layer, and a process of removing the stopper layer in the region vertically overlapping the cavity.

First, referring to FIG. 11A, a carrier board, which is a basic material for manufacturing a circuit board according to an embodiment, may be prepared.

The carrier board may include a carrier insulating layer 510 and a carrier copper foil layer 520 disposed on one surface of the carrier insulating layer 510.

The carrier copper foil layer 520 may be disposed on one surface of the carrier insulating layer 510, and differently, may be disposed on both surfaces thereof. When the carrier copper foil layers 520 are disposed on both surfaces of the carrier insulating layer 510, a circuit board manufacturing process may be performed on both sides of the carrier board, respectively, until the carrier board is removed.

The carrier copper foil layer 520 may be formed by performing electroless plating on a surface of the carrier insulating layer 510. Alternatively, the carrier insulating layer 510 and the carrier copper foil layer 520 may be a copper clad laminate (CCL).

In this case, the carrier board may be divided into a plurality of regions corresponding to the first region RB1 and the second region RB2 of the first substrate layer 200.

Next, in an embodiment, a process of forming a mask 530 on the lower surface of the carrier copper foil layer 520 may be performed. In this case, a process of forming an opening 540 in the mask 530 may be performed. The opening 540 of the mask 530 may vertically overlap a region in which a fifth pattern layer 321 is to be formed in the lower surface of the carrier copper foil layer 520.

Next, as shown in FIG. 11B, a process of forming a fifth pattern layer 321 filling the opening 540 of the mask 530 may be performed by electroplating the carrier copper foil layer 520 to a seed layer.

Further, in an embodiment, when the fifth pattern layer 321 is formed, a process of removing the mask 530 may be performed. Next, in an embodiment, when the mask 530 is removed, a process of forming a second-first insulating layer 311 that is a part of the second insulating layer of the second substrate layer 300 may be performed on the lower surface of the carrier copper foil layer 520 and the lower surface of the fifth pattern layer 321.

Next, as illustrated in FIG. 11C, an embodiment may proceed with a process of forming a through hole (not shown) penetrating the second-first insulating layer 311. Next, an embodiment may proceed with a process of forming a first dry film DF1 on the lower surface of the second-first insulating layer 311. The first dry film DF1 may include an opening (not shown) vertically overlapping a region in which the first pattern layer 221 is to be formed. Next, an embodiment may proceed with a process of forming a part of the first pattern layer 221 of the first substrate layer 200 and the first through electrode 331 filling the through hole of the second-first insulating layer 311.

Preferably, the first pattern layer 221 is performed through a two-stage plating process. Here, the two-stage plating may mean that the plating process of the electroplating layer excluding the seed layer is performed twice. For example, in a general circuit board manufacturing process, electroplating is performed on the seed layer to form a pattern layer, and accordingly, the electroplating layer of the pattern layer has a one-layer structure. Alternatively, functions of each region of the first pattern layer 221 of the embodiment are different. Accordingly, the embodiment allows the first pattern layer 221 to be formed through two-stage plating in order to form a pattern part suitable for each function, and, accordingly, the electroplating layer of the first pattern layer 221 may have a two-layer structure.

For example, the embodiment may proceed with a process of forming a first electroplating layer 221*a* filling at least a portion of the opening of the first dry film DF1 on the lower surface of the second-first insulating layer 311. In this case, the first electroplating layer 221*a* may correspond to the second metal layer 221-22 of the second pattern part 221-2 of the first pattern layer 221 and the third pattern part 221-3.

Next, as illustrated in FIG. 11D, the embodiment may proceed with a process of forming the second dry film DF2 on at least a portion of the lower surface of the first electroplating layer 221*a*. In this case, the second dry film DF2 is formed to cover at least a portion of the first electroplating layer 221*a*. In other words, the second dry film DF2 includes an opening (not shown) vertically overlapping at least a portion of the lower surface of the first electroplating layer 221*a*.

Next, as illustrated in FIG. 11E, in the embodiment, secondary electroplating may be performed on the lower surface of the first electrolytic plating layer 221*a* to form a second electrolytic plating layer 221*b* filling at least a part of the opening of the second dry film DF2.

In this case, the second electroplating layer 221*b* may correspond to the first pattern part 221-1 of the first pattern layer 221 and the first metal layer 221-21 of the second pattern part 221-2. Accordingly, a planar area of the first electroplating layer 221*a* may be different from a planar area of the second electroplating layer 221*b*. For example, the planar area of the first electroplating layer 221*a* may be larger than the planar area of the second electroplating layer 221*b*. In detail, the entire region of the second electroplating layer 221*b* may vertically overlap the first electroplating layer 221*a*. However, the first electroplating layer 221 a may include an overlapping region vertically overlapping the second electroplating layer 221*b* and a non-overlapping region not vertically overlapping the second electroplating layer 221*b*. For example, in an embodiment, the first electroplating layer 221*a* may function to protect the upper surface of the second electroplating layer 221*b* corresponding to the first pattern part 221-1 during the laser process while corresponding to a laser stopper. Accordingly, the planar area of the first electroplating layer 221*a* may be larger than the planar area of the second electroplating layer 221*b* to correspond to the planar area of the region in which the cavity C is to be formed.

Next, as illustrated in FIG. 11F, the embodiment may proceed with a process of removing the first dry film DF1 and the second dry film DF2. In addition, the embodiment may proceed with a process of removing the carrier insulating layer 510 and the carrier copper foil layer 520.

Thereafter, in the embodiment, a process of manufacturing a part of the second substrate layer 300 and a part of the first substrate layer 200 may be performed on the upper and lower portions of the second-first insulating layer 311, respectively.

For example, as illustrated in FIG. 11G, an embodiment may proceed with a process of forming a first-first insulating layer 211 on the lower surface of the second-first insulating layer 311, forming a first through electrode 231 penetrating the first-first insulating layer 211, and forming a second pattern layer 222 on the lower surface of the first-first insulating layer 211. Also, an embodiment may proceed with a process of forming a second-second insulating layer 312 on the upper surface of the second-first insulating layer 311, and forming a fifth through electrode 332 penetrating the second-second insulating layer 312 and a sixth pattern layer 322 on the upper surface of the second-second insulating layer 312.

Also, as illustrated in FIG. 11H, an embodiment may perform a process of forming the first-second insulating layer 212 on the lower surface of the first-first insulating layer 211. Also, an embodiment may perform a process of forming the third pattern layer 223 on the lower surface of the first-second insulating layer 212 and the second through electrode 232 penetrating the first-second insulating layer 212.

Furthermore, an embodiment may perform a process of forming a second-third insulating layer 313 on the upper surface of the second-second insulating layer 312. Furthermore, an embodiment may perform a process of forming a sixth through electrode 333 penetrating the second-third insulating layer 313 and a seventh pattern layer 323 on the upper surface of the second-third insulating layer 313.

Next, as shown in FIG. 11I, the embodiment may proceed with a process of forming the first-third insulating layer 213 on the lower surface of the first-second insulating layer 212. In addition, the embodiment may proceed with a process of forming a fourth pattern layer 224 on the lower surface of the first-third insulating layer 213 and the third through electrode 233 passing through the first-third insulating layer 213.

In addition, the embodiment may proceed with a process of forming the second-fourth insulating layer 314 on the upper surface of the second-third insulating layer 313. Next, the embodiment may proceed with a process of forming the eighth pattern layer 324 on the second-fourth insulating layer 314 and the seventh through electrode 334 passing through the second-fourth insulating layer 314.

Accordingly, in an embodiment, the manufacture of the circuit board 100 including the first substrate layer 200 and the second substrate layer 300 before the cavity C is formed may be completed.

Meanwhile, as shown in FIG. 11J, the embodiment does not remove a part of the seed layer of the eighth pattern layer 324 in the process of forming the eighth pattern layer 324, and uses this to be used as a mask in the process of forming the cavity C.

For example, as shown in FIG. 11K, in a process of manufacturing the eighth pattern layer 324, a seed layer 324-1 for forming the eighth pattern layer 324 by electroplating is positioned on an upper surface of the 2-4th insulating layer 314. In addition, the seed layer 324-1 may be used as a seed layer for electroplating the eighth pattern layer 324.

Next, as illustrated in FIG. 11L, when the eighth pattern layer 324 is formed, an embodiment may perform a process of removing a region of the seed layer 324-1 that does not vertically overlap the eighth pattern layer 324. In this case, an embodiment does not remove the region 324-1*a* adjacent to the region in which the cavity C is to be formed from the seed layer 324-1. When the process of forming the cavity is performed, the embodiment may proceed with a process of forming a cavity only in a portion corresponding to the third region RT1 using the region 324-1*a* of the seed layer 324-1 as a laser mask. In this case, the region RB1 of the seed layer 324-1 may cover a part of the third region RT1, which is the region in which the cavity C is to be formed. This may be in consideration of the undercut due to the process deviation occurring in the laser forming process.

Next, as illustrated in FIG. 11M, the embodiment may proceed with a process of forming a first cavity C1 penetrating the second insulating layers of the second substrate layer 300 by using the region RB1 of the seed layer 324-1. In this case, the first cavity C1 may be formed up to the upper surface (e.g., the upper surface of the third pattern part 221-3) of the first electrolytic plating layer 221*a* that is a part of the first pattern layer 221 of the first substrate layer 200. In this case, the inner wall IW1 of the first cavity C1 may have a first slope. For example, an embodiment may perform a first cavity process. In this case, a width of the laser mask in the first cavity process may have a first width. The laser mask determines a width of a laser beam in a laser equipment. In this case, in an embodiment, the first cavity process may be performed using a first laser beam having a relatively large width to entirely open a region in which a cavity is to be formed. Accordingly, an inner wall IW1 of the first cavity C1 formed by the first cavity process has a first slope corresponding to the first laser beam as a whole.

Next, as shown in FIG. 11N, the embodiment may proceed with a process of forming a second cavity C2 by performing a second cavity process on the first cavity C1. In this case, a width of the laser mask in the second cavity process may have a second width smaller than the first width. In addition, the second cavity process may be performed only on a portion corresponding to the inner wall of the first cavity C1 formed in the first cavity process. Since the width of the laser mask in the second cavity process has a second width smaller than the first width, the inner wall of the second cavity C2 may have a plurality of slopes. For example, the inner wall of the second cavity C2 may include a first slope formed by the first cavity process and a second slope formed by the second cavity process.

For example, referring to FIG. 11O, an embodiment may proceed with a process of forming the first cavity C1 by irradiating a corresponding first laser beam L1 using a mask having a first width of about 280 μm. Thereafter, an embodiment may proceed with a process of forming the second cavity C2 by irradiating a corresponding second laser beam L2 using a mask having a second width of about 100 μm smaller than the first width. Accordingly, the cavity of the embodiment includes a first slope corresponding to the first laser beam L1 and a second slope corresponding to the second laser beam L2. In this case, the overall slope of the cavity may have the second slope. However, in the first cavity process, the first laser beam L1 penetrates the lower surface of the region RB1 of the seed layer above 324-1, and includes an undercut region accordingly. And, a portion of the cavity C corresponding to the first slope may correspond to an undercut region formed in the first cavity process.

Next, as illustrated in FIG. 11P, the embodiment may proceed with a process of removing a part of the exposed third pattern part 221-3 through the second cavity process. For example, the third pattern part 221-3 may be removed from a region vertically overlapping the cavity C after the process of forming the cavity C is completed. However, the third pattern part 221-3 may have an area larger than an area of the lower region of the cavity C. Accordingly, at least a part of the third pattern part 221-3 may not be removed but may remain in the etching process. For example, the third pattern part 22first-third in the boundary region between the first region RB1 vertically overlapping the cavity C and the second region RB2 other than the first region RB1 may not be removed. In addition, in an embodiment, a third part of the cavity C may be formed by removing a part of the third pattern part 221-3. In this case, the inner wall of the third part may be a side surface of the third pattern part 221-3.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

The invention claimed is:

1. A circuit board comprising:

a first insulating layer;

a second insulating layer disposed on the first insulating layer and including a cavity; and a first circuit pattern layer disposed between the first insulating layer and the second insulating layer, wherein an upper surface of the first insulating layer includes a first region overlapping the cavity along a vertical direction and a second region other than the first region, wherein the first circuit pattern layer includes:

a first circuit pattern part disposed in the first region;

a second circuit pattern part disposed in the second region; and a third circuit pattern part disposed in a boundary region between the first region and the second region, wherein the cavity includes a first part formed in the second insulating layer and adjacent to an upper surface of the second insulating layer, a second part provided under the first part in the second insulating layer and adjacent to a lower surface of the second insulating layer, and a third part provided in the third circuit pattern part and formed by removing a portion of the third circuit pattern part, wherein an inner wall of the cavity includes a first inner wall of the first part, a second inner wall of the second part and a third inner wall of the third part, and wherein the first to third inner walls have different inclination angles from each other.

2. The circuit board of claim 1, wherein a thicknesses in the vertical direction of each of the first circuit pattern part, the second circuit pattern part, and the third circuit pattern part are different, and wherein an upper surface of the first circuit pattern part is positioned lower than an upper surface of each of the second circuit pattern part and the third circuit pattern part.

3. The circuit board of claim 1, wherein a lower surface of the third circuit pattern part is positioned higher than a lower surface of each of the first circuit pattern part and the second circuit pattern part.

4. The circuit board of claim 1, wherein the first inner wall of the first part has a first slope, and wherein the second inner wall of the second part has a second slope smaller than the first slope.

5. The circuit board of claim 1, wherein the third inner wall of the third part has a third slope having a curved surface.

6. The circuit board of claim 1, wherein an upper surface of the third circuit pattern part is positioned higher than an upper surface of the first circuit pattern part, and wherein a lower surface of the third circuit pattern part is positioned higher than a lower surface of the second circuit pattern part.

7. The circuit board of claim 6, wherein an upper surface of the first insulating layer includes a first upper surface corresponding to a lower surface of the cavity, and a second upper surface that does not overlap the cavity in the vertical direction, and wherein the first upper surface is positioned lower than the second upper surface.

8. The circuit board of claim 7, wherein the first upper surface of the first insulating layer is positioned lower than upper surfaces of the second circuit pattern part and the third circuit pattern part, and wherein the second upper surface of the first insulating layer is positioned on a same plane as the upper surfaces of the second circuit pattern part and the third circuit pattern part.

9. The circuit board of claim 7, wherein the first upper surface of the first insulating layer is positioned on a same plane as the upper surface of the first circuit pattern part or the lower surface of the third circuit pattern part.

10. The circuit board of claim 7, wherein the first upper surface of the first insulating layer has a step difference from the upper surface of the first circuit pattern part.

11. The circuit board of claim 6, further comprising:

a second circuit pattern layer disposed under the first insulating layer, wherein a number of layers of a metal layer of the second circuit pattern layer is different from a number of layers of a metal layer of the second circuit pattern part of the first circuit pattern layer.

12. The circuit board of claim 11, wherein the thickness of the second circuit pattern part of the first circuit pattern layer is same as the thickness of the second circuit pattern layer.

13. The circuit board of claim 1, wherein an upper surface of the third circuit pattern part is positioned on a same plane as an upper surface of the second circuit pattern part, and wherein a lower surface of the third circuit pattern part is positioned on a same plane or higher than an upper surface of the first circuit pattern part.

14. The circuit board of claim 1, wherein the second pattern circuit part includes:

a first metal layer horizontally overlapping the first circuit pattern part; and a second metal layer disposed on the first metal layer.

15. The circuit board of claim 14, wherein a thickness of the first metal layer of the second circuit pattern part is identical to the thickness of the first circuit pattern part, and wherein a thickness of the second metal layer of the second circuit pattern part is identical to a thickness of the third circuit pattern part.

16. The circuit board of claim 1, wherein the thickness of the first circuit pattern part satisfies a range of 51% to 85% of the thickness of the second circuit pattern part, and wherein the thickness of the third circuit pattern part satisfies a range of 15% to 49% of the thickness of the second circuit pattern part.

17. The circuit board of claim 1, further comprising:

a first through electrode passing through at least a part of the first insulating layer and connected to any one of the first circuit pattern part and the second circuit pattern part of the first circuit pattern layer, wherein a thickness of the first through electrode is less than or equal to the thickness of the second circuit pattern part of the first circuit pattern layer.

18. The circuit board of claim 1, wherein a vertical length of the first inner wall is smaller than a vertical length of the second inner wall.

19. The circuit board of claim 1, wherein a vertical length of the third inner wall is smaller than a vertical length of each of the first inner wall and the second inner wall.

20. The circuit board of claim 1, further comprising: a second through electrode passing through at least a part of the second insulating layer and overlapping the second inner wall in a horizontal direction.

* * * * *